US012713795B2

(12) United States Patent
Lee et al.

(10) Patent No.: US 12,713,795 B2
(45) Date of Patent: Aug. 18, 2026

(54) DISPLAY DEVICE

(71) Applicant: SAMSUNG DISPLAY CO., LTD., Yongin-si (KR)

(72) Inventors: Wonse Lee, Yongin-si (KR); Sujin Lee, Yongin-si (KR); Jieun Lee, Yongin-si (KR); Donghyeon Jang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 391 days.

(21) Appl. No.: 18/517,064

(22) Filed: Nov. 22, 2023

(65) Prior Publication Data

US 2024/0292690 A1 Aug. 29, 2024

(30) Foreign Application Priority Data

Feb. 23, 2023 (KR) ........................ 10-2023-0024643

(51) Int. Cl.

*H10K 59/131* (2023.01)
*H10K 59/121* (2023.01)
*H10K 59/124* (2023.01)
*H10K 59/35* (2023.01)

(52) U.S. Cl.

CPC ....... *H10K 59/131* (2023.02); *H10K 59/1213* (2023.02); *H10K 59/1216* (2023.02); *H10K 59/124* (2023.02); *H10K 59/353* (2023.02)

(58) Field of Classification Search

CPC ............. H10K 59/131; H10K 59/1213; H10K 59/1216; H10K 59/124; H10K 59/353; H10K 59/121; H10K 77/10

See application file for complete search history.

(56) References Cited

U.S. PATENT DOCUMENTS 11,108,006 B2 * 8/2021 Kim ....................... H10D 86/40
2017/0077207 A1 * 3/2017 Kim ..................... H10K 59/131
(Continued)

FOREIGN PATENT DOCUMENTS

KR 10-2020-0089380 7/2020
KR 10-2020-0102580 9/2020
(Continued)

*Primary Examiner* — Alexander G Ghyka
(74) *Attorney, Agent, or Firm* — F. CHAU & ASSOCIATES, LLC

(57) ABSTRACT

A display device includes: a substrate including a main display area and a component area, wherein the component area includes a transmission area and an auxiliary display area; a first thin-film transistor disposed in the component area and including a first semiconductor layer and a first gate electrode; a second thin-film transistor disposed in the component area and including a second semiconductor layer and a second gate electrode; a third gate electrode interposed between the first semiconductor layer and the second gate electrode; a first wiring extending within the auxiliary display area, and provided on a same layer as the third gate electrode; and a second wiring extending within the auxil-iary display area, and provided on a same layer as the second gate electrode, wherein the first wiring and the second wiring are electrically connected to each other through a first contact hole penetrating insulating layers.

20 Claims, 19 Drawing Sheets

(56) References Cited

U.S. PATENT DOCUMENTS

| | | | | |
|---|---|---|---|---|
| 2017/0236890 | A1* | 8/2017 | Park | H10K 59/80515 257/40 |
| 2019/0081090 | A1* | 3/2019 | Lee | H10D 86/60 |
| 2020/0194529 | A1* | 6/2020 | Lee | H01L 23/585 |
| 2021/0066430 | A1* | 3/2021 | Cha | H10K 59/131 |
| 2021/0091157 | A1 | 3/2021 | Oh et al. | |
| 2021/0377496 | A1 | 12/2021 | Kim et al. | |
| 2022/0045159 | A1* | 2/2022 | Lee | H10K 59/121 |
| 2022/0157906 | A1 | 5/2022 | Bae et al. | |
| 2022/0254849 | A1 | 8/2022 | Lee et al. | |
| 2023/0030096 | A1* | 2/2023 | Lee | H10K 59/124 |
| 2024/0057430 | A1* | 2/2024 | Lee | H10K 59/131 |

FOREIGN PATENT DOCUMENTS

| | | |
|---|---|---|
| KR | 10-2021-0148682 | 12/2021 |
| KR | 10-2022-0115709 | 8/2022 |

* cited by examiner

1
TA
H3
H2
H1
BML
Wt
20
CA
MDA
(OLED')
Pa
OP2
220b'
210'
CE2a
CE1a
Cst'
Ga
Aa
Da
Sa
TFT'
(OLED)
Pm
OP1
220b
210
CE2m
CE1m
Cstm
Dm
Gm
Am
Sm
TFTm
330
320
310
300
250
230
220c
220a
220e
119
118
117
116
115
114
113
112
IL
111b
111a
111
110
x
z

DISPLAY DEVICE

CROSS-REFERENCE TO RELATED APPLICATION

This application claims priority under 35 U.S.C. § 119 to Korean Patent Application No. 10-2023-0024643, filed on Feb. 23, 2023, in the Korean Intellectual Property Office, the disclosure of which is incorporated by reference herein in its entirety.

TECHNICAL FIELD

One or more embodiments of the present invention relate to a display device.

DISCUSSION OF THE RELATED ART

Display devices are devices for displaying data visually. These display devices may provide images by using light-emitting diodes. The uses of such display devices are diversifying, and various designs for increasing the quality of the display devices are currently under development.

SUMMARY

According to an embodiment of the present invention, a display device includes: a substrate including a main display area, a component area, and a peripheral area, wherein the component area includes a transmission area and an auxiliary display area that is spaced apart from the main display area with the transmission area disposed therebetween; a first thin-film transistor disposed in the component area and including a first semiconductor layer and a first gate electrode insulated from the first semiconductor layer; a second thin-film transistor disposed in the component area and including a second semiconductor layer and a second gate electrode insulated from the second semiconductor layer; a third gate electrode interposed between the first semiconductor layer and the second gate electrode and insulated from the first semiconductor layer and the second gate electrode; a first wiring disposed to extend in a first direction within the auxiliary display area of the component area, and provided on a same layer and with a same material as the third gate electrode; and a second wiring disposed to extend in a first direction within the auxiliary display area of the component area, and provided on a same layer and with a same material as the second gate electrode, wherein the first wiring and the second wiring are electrically connected to each other through a first contact hole penetrating insulating layers disposed between the first wiring and the second wiring.

In an embodiment of the present invention, the first wiring and the second wiring overlap at least a portion of the second semiconductor layer.

In an embodiment of the present invention, the first wiring is disposed only in the auxiliary display area of the component area.

In an embodiment of the present invention, the first wiring and the second wiring are disposed to overlap each other in the auxiliary display area of the component area.

In an embodiment of the present invention, the first contact hole is located at a boundary between the auxiliary display area and the transmission area.

In an embodiment of the present invention, the first contact hole is spaced apart from the second thin-film transistor in the first direction.

In an embodiment of the present invention, the second wiring is disposed in the component area and comprises a bypass line bypassing the transmission area.

In an embodiment of the present invention, the display device further includes a bottom metal layer disposed in the component area and including a first hole corresponding to the transmission area.

In an embodiment of the present invention, the bypass line overlaps the bottom metal layer.

In an embodiment of the present invention, the display device further includes main sub-pixels arranged in the main display area.

In an embodiment of the present invention, the display device further includes a plurality of auxiliary sub-pixels arranged in the auxiliary display area.

In an embodiment of the present invention, the main sub-pixels include a main display element and a main pixel circuit electrically connected to the main display element.

In an embodiment of the present invention, the auxiliary sub-pixels include an auxiliary display element and an auxiliary sub-pixel circuit electrically connected to the auxiliary display element, and the auxiliary sub-pixel circuit comprises the first thin-film transistor and the second thin-film transistor.

In an embodiment of the present invention, the display device further includes a component disposed below the substrate to correspond to the component area, wherein the component includes an image capturing device or a sensor.

According to an embodiment of the present invention, a display device includes: a substrate including a main display area, a component area, and a peripheral area, wherein the component area includes a transmission area and auxiliary display areas that are spaced apart from each other with the transmission area therebetween; a first thin-film transistor disposed in the component area and including a first semiconductor layer and a first gate electrode insulated from the first semiconductor layer; a second thin-film transistor disposed in the component area and including a second semiconductor layer and a second gate electrode insulated from the second semiconductor layer; a first wiring disposed to extend in a first direction within an auxiliary display area of the component area, and provided on a same layer and with a same material as the first gate electrode; and a second wiring disposed to extend in a first direction within an auxiliary display area of the component area, and provided on a same layer and with a same material as the second gate electrode, wherein the first wiring and the second wiring are electrically connected to each other through a first contact hole formed in an insulating layer that is between the first wiring and the second wiring.

In an embodiment of the present invention, the first wiring and the second wiring overlap at least a portion of the second semiconductor layer.

In an embodiment of the present invention, the first wiring has an isolated shape only in the auxiliary display area of the component area.

In an embodiment of the present invention, the first wiring and the second wiring are disposed to overlap each other in the auxiliary display area of the component area.

In an embodiment of the present invention, the first contact hole is located at a boundary that is between the auxiliary display area and the transmission area.

In an embodiment of the present invention, the first contact hole is spaced apart from the second thin-film transistor in the first direction.

BRIEF DESCRIPTION OF THE DRAWINGS

The above and other features of the present invention will be more apparent by describing in detail embodiments thereof, with reference to the accompanying drawings, in which.

DETAILED DESCRIPTION OF THE EMBODIMENTS

Figure 1:
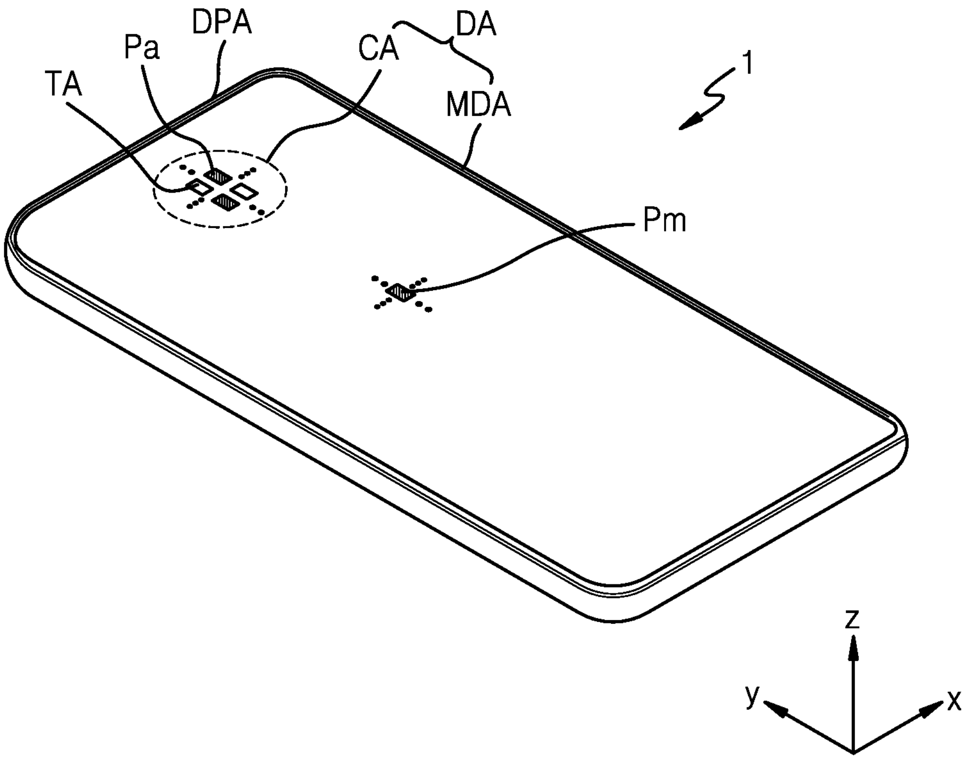
FIG. 1 is a perspective view schematically illustrating a display device according to an embodiment of the present invention.

Exemplary embodiments of the present invention will now be described more fully with reference to the accompanying drawings. It is to be understood that the present invention may be embodied in different forms and thus should not be construed as being limited to the exemplary embodiments set forth herein. It is to be understood that like reference numerals may refer to like elements throughout the specification, and thus redundant descriptions may be omitted. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of the present invention.

It will be understood that the singular expression includes a plurality of expressions unless the context is clearly different.

It will be understood that when an element or layer is referred to as being "on" another element or layer, the element or layer may be directly on another element or layer or intervening elements or layers.

In the drawings, various thicknesses, lengths, and angles are shown and while the arrangement shown does indeed represent an embodiment of the present invention, it is to be understood that modifications of the various thicknesses, lengths, and angles may be possible within the spirit and scope of the present invention and the present invention is not necessarily limited to the particular thicknesses, lengths, and angles shown.

In the case where some embodiments of the present invention may be implemented differently, a specific process order may be performed differently from the order described. For example, two processes described in succession may be performed at substantially the same time, or in an order opposite to a described order.

It will be understood that when an element is referred to as being "connected" or "coupled" to another element, the element may be directly connected or coupled to the other element or intervening elements.

The x-axis, the y-axis, and the z-axis are not limited to three axes on a Cartesian coordinate system, and may be interpreted in a broad sense including the same. For example, the x-axis, the y-axis, and the z-axis may be perpendicular to each other, but may refer to different directions that are not orthogonal to each other.

FIG. 1 is a perspective view schematically illustrating a display device according to an embodiment of the present invention.

Referring to FIG. 1, a display device 1 may include a display area DA and a peripheral area DPA of the display area DA. The display area DA may include a component area CA, and a main display area MDA at least partially surrounding the component area CA. For example, each of the component area CA and the main display area MDA may display an image individually or together. The peripheral area DPA may be a non-display area in which display elements are not arranged. The display area DA may be surrounded by the peripheral area DPA.

FIG. 1 illustrates that one component area CA is within the main display area MDA. In an embodiment of the present invention, the display device 1 may have two or more component areas CA, and shapes and sizes of a plurality of component areas CA may be different from each other. When viewed in a direction approximately perpendicular to an upper surface of the display device 1, the component area CA may have various shapes such as a polygonal shape, for example, a circular shape, an elliptical shape, or a rectangular shape, a star shape, a diamond shape, and the like. FIG. 1 illustrates that the component area CA is at a center of an upper area of the main display area MDA having an approximately rectangular shape when viewed in a direction approximately perpendicular to the upper surface of the display device 1. However, the component area CA may also be at one side, for example, a right upper side or a left upper side of the main display area MDA having a rectangular shape.

The display device 1 may provide an image by using a plurality of main sub-pixels Pm arranged in the main display area MDA and a plurality of auxiliary sub-pixels Pa arranged in the component area CA.

A component 20 that is an electronic element may be disposed below a substrate 100 to correspond to the component area CA, as will be described below with reference to FIG. 2. The component 20 may include, for example, an image capturing element as a camera using ultraviolet rays, visible light, or the like. Alternatively, the component 20 may be a solar cell, a flash, an illuminance sensor, a proximity sensor, or an iris sensor. In addition, the component 20 may have a function of receiving sound. To minimize limitation of the function of the component 20, the component area CA may include a transmission area TA through which light or/and sound etc., output from the component 20 to the outside or proceeding toward the component 20 from the outside may be transmitted. In a display device according to an embodiment of the present invention, when light transmits through the component area CA, light transmittance may be greater than or equal to about 10%, for example, greater than or equal to about 40%, greater than or equal to about 25%, greater than or equal to about 50%, greater than or equal to about 85%, or greater than or equal to about 90%.

A plurality of auxiliary sub-pixels Pa may be arranged in the component area CA. The plurality of auxiliary sub-pixels Pa may emit light, thereby providing a certain image. An image displayed in the component area CA may be an auxiliary image, and may have a resolution lower than that of an image displayed in the main display area MDA. For example, the component area CA may include a transmission area TA through which light or/and sound may transmit, and when sub-pixels are not arranged in the transmission area TA, the number of the auxiliary sub-pixels Pa that may be arranged per unit area may be less than the number of the main sub-pixels Pm arranged per unit area in the main display area MDA.

Figure 2:
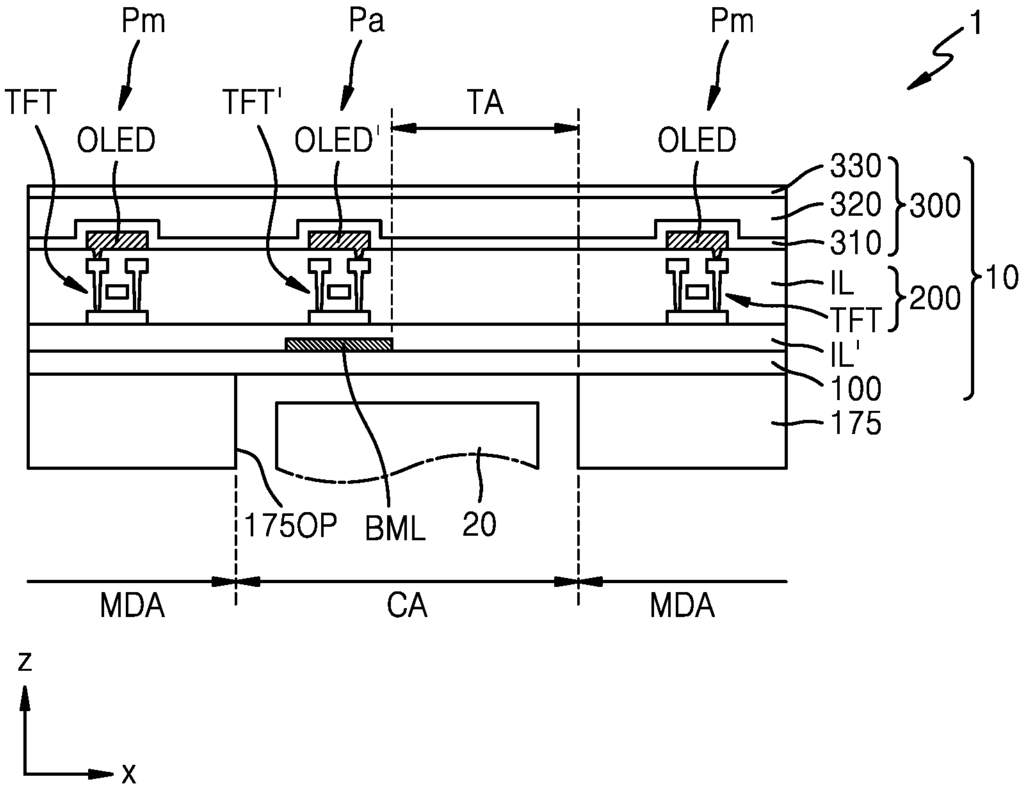
FIG. 2 is a cross-sectional view schematically illustrating a display device according to an embodiment of the present invention.

FIG. 2 is a cross-sectional view schematically illustrating a display device according to an embodiment of the present inventive concept.

Referring to FIG. 2, a display device 1 may include a display panel 10 including a display element, and a component 20 corresponding to the component area CA.

The display panel 10 may include the substrate 100, a display element layer 200 disposed on the substrate 100, and a thin-film encapsulation layer 300 as a sealing member for sealing the display element layer 200. In addition, the display panel 10 may further include a lower protective film 175 disposed under the substrate 100.

The substrate 100 may include, for example, glass or polymer resin. The polymer resin may include, for example, polyethersulfone, polyacrylate, polyether imide, polyethylene naphthalate, polyethylene terephthalate, polyphenylene sulfide, polyarylate, polyimide, polycarbonate or cellulose acetate propionate. The substrate 100 including the polymer resin may have flexible, rollable or bendable characteristics. For example, the substrate 100 may have a multi-layered structure including a layer including the above-described polymer resin and an inorganic layer.

The display element layer 200 may include a circuit layer including thin-film transistors (TFT and TFT'), an organic light emitting diode (OLED) as a display element, and insulating layers IL and IL' therebetween.

A main TFT, and a main OLED connected to the main TFT are arranged in the main display area MDA of the display panel 10 so that main sub-pixels Pm may be implemented. An auxiliary TFT' and an auxiliary OLED' connected to the auxiliary TFT' are arranged in the component area CA so that auxiliary sub-pixels Pa may be implemented. An area in which the auxiliary sub-pixels Pa are arranged, of the component area CA, may be referred to as an auxiliary display area.

In addition, the transmission area TA in which display elements are not disposed, may be in the component area CA. The transmission area TA may be an area through which light/signal emitted from the component 20 disposed to correspond to the component area CA or light/signal incident onto the component 20 transmits. The auxiliary display area and the transmission area TA may be alternately arranged in the component area CA.

A bottom metal layer BML may be arranged in the component area CA. The bottom metal layer BML may be arranged to correspond to a lower portion of the auxiliary TFT'. The bottom metal layer BML may prevent external light from reaching the auxiliary sub-pixels Pa including the auxiliary TFT'. For example, the bottom metal layer BML may prevent light emitted from the component 20 from reaching the auxiliary sub-pixels Pa. In some embodiments of the present invention, a constant voltage or a signal may be applied to the bottom metal layer BML to prevent damage to the pixel circuit due to electrostatic discharge.

The thin-film encapsulation layer 300 may include at least one inorganic encapsulation layer and at least one organic encapsulation layer. In this regard, FIG. 2 illustrates a first inorganic encapsulation layer 310, a second inorganic encapsulation layer 330, and an organic encapsulation layer 320 disposed therebetween.

The first inorganic encapsulation layer 310 and the second inorganic encapsulation layer 330 may include at least one, for example, of aluminum oxide, titanitum oxide, tantalum oxide, hafnium oxide, zinc oxide, silicon oxide, silicon nitride, and silicon oxynitride. The organic encapsulation layer 320 may include, for example, a polymer-based material. For example, the polymer-based material may include an acryl-based resin, an epoxy-based resin, polyimide, polyethylene, or the like.

The lower protective film 175 may be attached to a lower portion of the substrate 100 and may support and protect the substrate 100. The lower protective film 175 may include an opening 175OP corresponding to the component area CA. The opening 175OP may be provided in the lower protective film 175 so that light transmittance of the component area CA may be increased. The lower protective film 175 may include, for example, polyethylene terephthalate or polyimide.

The area of the component area CA may be greater than the area in which the component 20 is disposed. Thus, the area of the opening 175OP provided in the lower protective film 175 might not coincide with the area of the component area CA. For example, the area of the opening 175OP may be less than the area of the component area CA.

In addition, a plurality of components 20 may be arranged in the component area CA. The plurality of components 20 may have different functions from each other. For example, one of the plurality of components 20 may be a camera, and the other one thereof may be an infrared ray sensor.

Components such as an input sensing member for sensing touch input, a reflection prevention member including a polarizer, a retarder or a color filter and a black matrix, and a transparent window may be further disposed on the display panel 10.

In the present embodiment, the thin-film encapsulation layer 300 may be used as an encapsulation layer for sealing the display element layer 200. However, the present inventive concept is not limited thereto. For example, a sealing substrate to be combined with the substrate 100 by a sealant or frit may be used as a member for sealing the display element layer 200.

Figure 3:
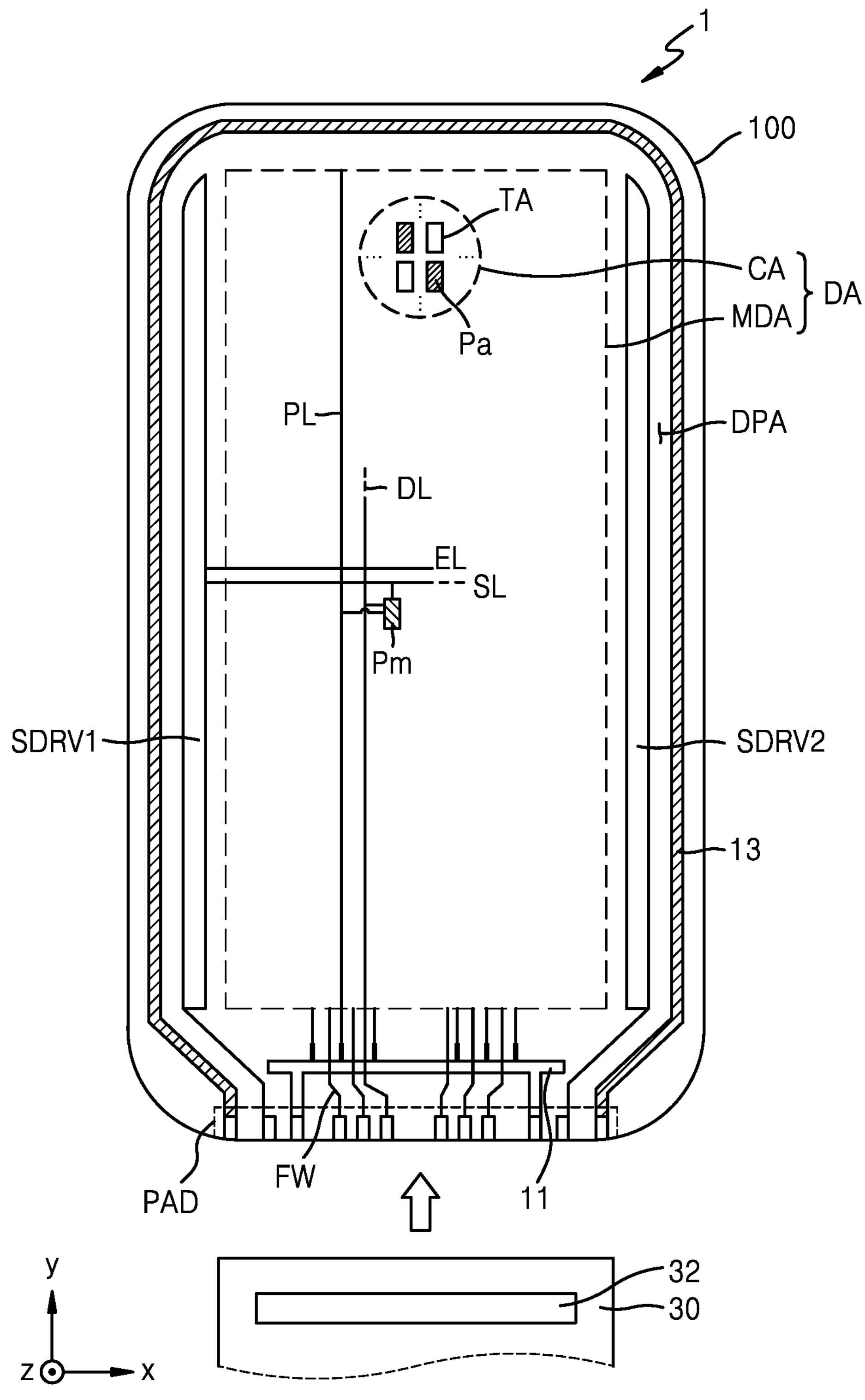
FIG. 3 is a plan view schematically illustrating a display device according to an embodiment of the present invention.

FIG. 3 is a plan view schematically illustrating a display device according to an embodiment of the present invention.

Referring to FIG. 3, various components of the display device 1 may be arranged on the substrate 100. The substrate 100 may include a display area DA, and a peripheral area PDA at least partially surrounding the display area DA. The display area DA may include a main display area MDA, in which a main image is displayed, and a component area CA, which has a transmission area TA and in which an auxiliary image is displayed. The auxiliary image may constitute one image together with the main image, or an image independent from the main image.

A plurality of main sub-pixels Pm may be arranged in the main display area MDA. Each of the main sub-pixels Pm may be implemented as a display element such as an OLED. Each main sub-pixel Pm may emit red, green, blue or white light, for example. The main display area MDA may be covered by the sealing member and protected from external air or moisture, etc.

The component area CA may be at one side of the main display area MDA, as described above, or may be inside the display area DA and thus may be surrounded by the main display area MDA. A plurality of auxiliary sub-pixels Pa may be arranged in the component area CA. Each of the plurality of auxiliary sub-pixels Pa may be implemented by a display element such as an OLED. Each auxiliary sub-pixel Pa may emit red, green, blue or white light, for example. The component area CA may be covered by the sealing member and protected from external air or moisture, etc.

The component area CA may have the transmission area TA. The transmission area TA may at least partially surround the plurality of auxiliary sub-pixels Pa. In addition, the transmission area TA may have a grid shape with the plurality of auxiliary sub-pixels Pa.

Since the component area CA has the transmission area TA, the resolution of the component area CA may be lower than the resolution of the main display area MDA. For example, the resolution of the component area CA may be about 1/2, 3/8, 1/3, 1/4, 2/9, 1/8, 1/9, 1/16, etc. of the resolution of the main display area MDA. For example, the resolution of the main display area MDA may be about 400 ppi or more, the resolution of the component area CA may be about 200 ppi or about 100 ppi.

Pixel circuits for driving the main sub-pixels Pm and the auxiliary sub-pixels Pa may be electrically connected to outer circuits that are arranged in the peripheral area DPA, respectively. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the pixel circuits for driving the main sub-pixels Pm and the auxiliary sub-pixels Pa through the scan line SL. The first scan driving circuit SDRV1 may apply an emission control signal to each pixel circuit through an emission control line EL. The second scan driving circuit SDRV2 may be located at an opposite side to the first scan driving circuit SDRV1 centering on the main display area MDA, and may face the first scan driving circuit SDRV1. A part of sub-pixel circuits of the main sub-pixels Pm of the main display area MDA may be electrically connected to the first scan driving circuit SDRV1, and the other parts of the main sub-pixels Pm of the main display area MDA may be electrically connected to the second scan driving circuit SDRV2. A part of sub-pixel circuits of the auxiliary sub-pixels Pa of the component area CA may be electrically connected to the first scan driving circuit SDRV1, and the other parts of the sub-pixel circuits of the auxiliary sub-pixels Pa of the component area CA may be electrically connected to the second scan driving circuit SDRV2. The second driving circuit SDRV2 may be omitted.

The terminal portion PAD may be disposed at one side of the substrate 100. The terminal portion PAD might not be covered by an insulating layer but may be exposed, and thus, may be connected to a display circuit board 30. A display driving portion 32 may be disposed on the display circuit board 30.

The display driving portion 32 may generate a control signal to be transmitted to the first scan driving circuit SDRV1 and the second scan driving circuit SDRV2. The display driving portion 32 may generate a data signal, and the generated data signal may be transmitted to the pixel circuits of the main sub-pixels Pm and the auxiliary sub-pixels Pa through a fanout wiring FW and a data line DL connected to the fanout wiring FW.

The display driving portion 32 may supply a driving voltage ELVDD to the driving voltage supply line 11 and may supply a common voltage ELVSS to the common voltage supply line 13. The driving voltage ELVDD may be applied to the pixel circuits of the main sub-pixels Pm and the auxiliary sub-pixels Pa through the driving voltage line PL that is connected to the driving voltage supply line 11, and the common voltage ELVSS may be connected to the common voltage supply line 13 and applied to an opposite electrode of the display element.

The driving voltage supply line 11 may extend from a lower side of the main display area MDA in an x direction. The common voltage supply line 13 may form a loop shape with an open side and may partially surround the main display area MDA.

Figure 4:
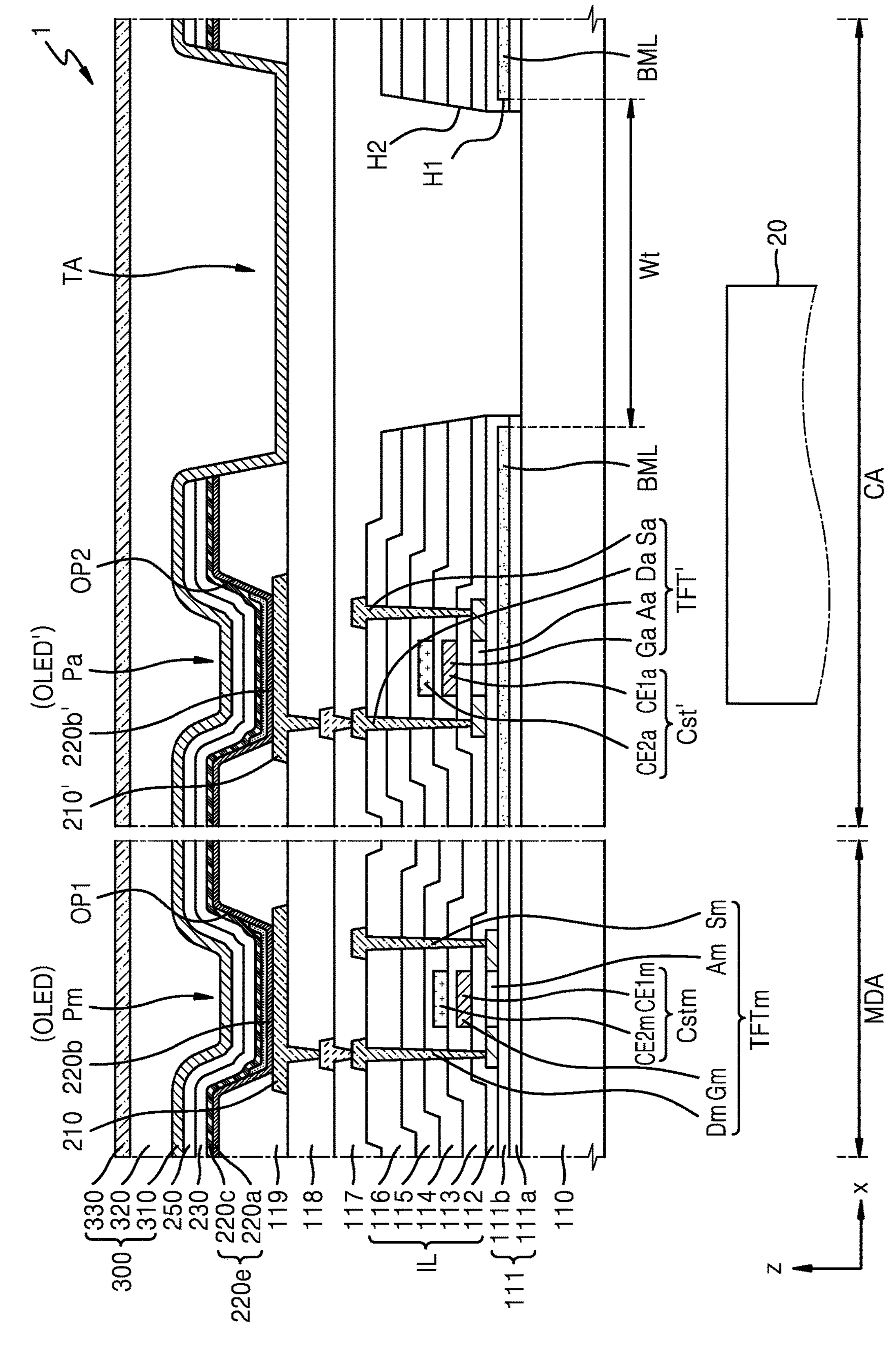
FIG. 4 is a cross-sectional view schematically illustrating a display device according to an embodiment of the present invention.

FIG. 4 is a cross-sectional view schematically illustrating a display device according to an embodiment of the present inventive concept. FIG. 4 is a schematic cross-sectional view illustrating a part of the display device 1 according to an embodiment of the present inventive concept, which schematically illustrates the main display area MDA and the component area CA.

Referring to FIG. 4, the display device 1 may include the main display area MDA and the component area CA. Main sub-pixels Pm may be arranged in the main display area MDA, and auxiliary sub-pixels Pa may be arranged in the component area CA. The component area CA may have the transmission area TA.

A main sub-pixel circuit, which includes a main TFT and a main storage capacitor Cst, and a main OLED, which is a main display element connected to the main sub-pixel circuit, may be arranged in the main display area MDA. An auxiliary sub-pixel circuit, which includes an auxiliary TFT' and an auxiliary storage capacitor Cst', and an auxiliary OLED', which is an auxiliary display element connected to the auxiliary sub-pixel circuit, may be arranged in the component area CA.

In the present embodiment, an OLED may be employed as the display element. However, in an embodiment of the present invention, an inorganic light-emitting device or a quantum light-emitting device, or the like may be employed as the display element.

A buffer layer 111 may be disposed on the substrate 100. The buffer layer 111 may be located on the substrate 100, may reduce or prevent penetration of foreign substances, moisture or external air from the lower portion of the substrate 100, and may provide a flat surface to the substrate 100. The buffer layer 111 may include, for example, an inorganic material such as oxide or nitride, an organic material, or an organic/inorganic composite material, and may have a single layer or multi-layered structure of the inorganic material and the organic material. A barrier layer for preventing penetration of external air may be disposed between the substrate 100 and the buffer layer 111. In some embodiments of the present invention, the buffer layer 111 may include at least one of silicon oxide ($SiO_2$), silicon nitride (SINx), and silicon oxynitride (SIOXNY). The buffer layer 111 may be provided in a structure in which a first buffer layer 111*a* and a second buffer layer 111*b* are stacked. In this case, the first buffer layer 111*a* and the second buffer layer 111*b* may include different materials from each other. For example, the first buffer layer 111*a* may include silicon nitride, and the second buffer layer 111*b* may include silicon oxide. The buffer layer 111 in the component area CA may have an opening corresponding to the transmission area TA. FIG. 4 illustrates that at least a portion of the first buffer layer 111*a* and the second buffer layer 111*b* is removed, and thus, the first buffer layer 111*a* and the second buffer layer 111*b* have an opening corresponding to the transmission area TA. However, the present invention is not limited thereto. The portion of the first buffer layer 111*a* overlapping the transmission area TA may be removed. In addition, the portion of the second buffer layer 111*b* overlapping the transmission area TA may be removed.

In the component area CA, the bottom metal layer BML may be between the first buffer layer 111*a* and the second buffer layer 111*b*. In another embodiment, the bottom metal layer BML may be disposed between the substrate 100 and the first buffer layer 111*a*. The bottom metal layer BML may be disposed at a lower portion of the auxiliary TFT' and may prevent characteristics of the auxiliary TFT' from being deteriorated by light emitted from the component 20 or the like.

The bottom metal layer BML may include, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The bottom metal layer BML may have a single layer or multi-layered structure of the above-described materials.

The bottom metal layer BML in the component area CA may overlap an auxiliary pixel circuit PC' in the component area CA. For example, the bottom metal layer BML in the component area CA may correspond to the whole of the component area CA. In this case, the bottom metal layer BML may have a first hole H1 corresponding to the transmission area TA. In some embodiments of the present invention, the shape and size of the transmission area TA may be defined by the shape and size of the first hole H1 defined by the bottom metal layer BML. A smallest width Wt of the transmission area TA may be the same as the width of the first hole H1 defined by the bottom metal layer BML.

The bottom metal layer BML might not be disposed in the main display area MDA. When the bottom metal layer BML is provided on the entire surface of the substrate 100 or a greater part of the substrate 100, defects may occur in a process of crystalizing a semiconductor layer of the main TFT by using laser.

The main TFT and the auxiliary TFT may be arranged on the buffer layer 111. The main TFT may include a main semiconductor layer Am, a main gate electrode Gm, a main source electrode Sm, and a main drain electrode Dm. The auxiliary TFT' may include an auxiliary semiconductor layer Aa, an auxiliary gate electrode Ga, an auxiliary source electrode Sa, and an auxiliary drain electrode Da. The main TFT may be connected to the main OLED to drive the main OLED. The auxiliary TFT' may be connected to the auxiliary OLED' to drive the auxiliary OLED'.

The main semiconductor layer Am and the auxiliary semiconductor layer Aa may be arranged on the buffer layer 111 and may include polysilicon. In an embodiment of the present invention, the main semiconductor layer Am and the auxiliary semiconductor layer Aa may include amorphous silicon. In an embodiment of the present invention, the main semiconductor layer Am and the auxiliary semiconductor layer Aa may include oxide including at least one of, for example, indium (In), gallium (Ga), stannum (Sn), zirconium (Zr), vanadium (V), hafnium (Hf), cadmium (Cd), germanium (Ge), chromium (Cr), titanium (Ti), and zinc (Zn). The main semiconductor layer Am and the auxiliary semiconductor layer Aa may each include a channel region, a source region, and a drain region. The source and drain regions may be doped with impurities.

The auxiliary semiconductor layer Aa may overlap the bottom metal layer BML with the buffer layer 111 therebetween. In an embodiment of the present invention, the width of the auxiliary semiconductor layer Aa may be less than the width of the bottom metal layer BML. Thus, when projected in a direction perpendicular to the substrate 100, the bottom metal layer BML may entirely overlap the auxiliary semiconductor layer Aa.

A first insulating layer 112 may be provided to cover the main semiconductor layer Am and the auxiliary semiconductor layer Aa. The first insulating layer 112 may include an inorganic insulating material such as silicon oxide ($SiO_2$), silicon nitride (SiNx), silicon oxynitride (SiOXNY), aluminum oxide ($Al_2O_3$), titanium oxide ($TiO_2$), tantalum oxide ($Ta_2O_5$), hafnium oxide ($HfO_2$), or zinc oxide ($ZnO_2$). The first semiconductor layer 112 may have a single layer or multi-layered structure including the above-described inorganic insulating materials.

A main gate electrode Gm overlapping the main semiconductor layer Am may be disposed on the first insulating layer 112, and the auxiliary gate electrode Ga overlapping the auxiliary semiconductor layer Aa may be disposed on the first insulating layer 112. The main gate electrode Gm and the auxiliary gate electrode Ga may include, for example, molybdenum (Mo), Al, Cu, Ti, etc., and may have a single layer or multi-layered structure.

The second insulating layer 113 may be provided to cover the main gate electrode Gm and the auxiliary gate electrode Ga. The second insulating layer 113 may include an inorganic insulating material such as silicon oxide ($SiO_2$), silicon nitride (SiNx), silicon oxynitride (SIOXNY), aluminum oxide ($Al_2O_3$), titanium oxide ($TiO_2$), tantalum oxide ($Ta_2O_5$), hafnium oxide ($HfO_2$), or zinc oxide ($ZnO_2$). The second semiconductor layer 113 may have a single layer or multi-layered structure including the above-described inorganic insulating materials.

A main upper electrode CE2*m* of a main storage capacitor Cstm and an auxiliary upper electrode CE2*a* of an auxiliary storage capacitor Cst' may be arranged on the second insulating layer 113.

In the main display area MDA, the main upper electrode CE2*m* may overlap the main gate electrode Gm disposed under the main upper electrode CE2*m*. The main gate electrode Gm and the main upper electrode CE2*m* overlapping each other with the second insulating layer 113 disposed therebetween may constitute the mains storage capacitor Cstm. The main gate electrode Gm may be provided integrally with the main lower electrode CE1*m* of the main storage capacitor Cstm. In an embodiment of the present invention, the main storage capacitor Cstm might not overlap the main TFT, and the main lower electrode CE1*m* of the main storage capacitor Cstm may be a separate component independent from the main gate electrode Gm of the main TFTm.

In the component area CA, the auxiliary upper electrode CE2*a* may overlap the auxiliary gate electrode Ga disposed under the auxiliary upper electrode CE2*a*. The auxiliary gate electrode Ga and the auxiliary upper electrode CE2*a* overlapping each other with the second insulating layer 113 therebetween may constitute the auxiliary storage capacitor Cst'. The auxiliary gate electrode Ga may be provided integrally with the auxiliary lower electrode CE1*a* of the auxiliary storage capacitor Cst'. In an embodiment of the present invention, the auxiliary storage capacitor Cst' might not overlap the auxiliary TFT', and the auxiliary lower electrode CE1*a* of the auxiliary storage capacitor Cst' may be a separate component independent from the auxiliary gate electrode Ga of the auxiliary TFT'.

The main upper electrode CE2*m* and the auxiliary upper electrode CE2*a* may include, for example, Al, Pt, Pd, Ag, Mg. Au, Ni, Nd, Ir, Cr, Ca, Mo, Ti, W, and/or Cu, and may have a single layer or multi-layered structure of the above-described materials.

The third insulating layer 114 may be provided to cover the main upper electrode CEm and the auxiliary upper electrode CE2*a*. The third insulating layer 114 may include an inorganic insulating material such as silicon oxide ($SiO_2$), silicon nitride (SiNx), silicon oxynitride (SiOXNY), aluminum oxide ($Al_2O_3$), titanium oxide ($TiO_2$), tantalum oxide ($Ta_2O_5$), hafnium oxide ($HfO_2$), or zinc oxide ($ZnO_2$). The third insulating layer 114 may have a single layer or multi-layered structure including the above-described inorganic insulating materials. An oxide semiconductor layer may be disposed on the third insulating layer 114.

In an embodiment of the present invention, a fourth insulating layer 115 and a fifth insulating layer 116 may be arranged on the third insulating layer 114. The fourth insulating layer 115 may include an inorganic insulating material such as silicon oxide ($SiO_2$), silicon nitride (SiNx), silicon oxynitride (SiOXNY), aluminum oxide ($Al_2O_3$), titanium oxide ($TiO_2$), tantalum oxide ($Ta_2O_5$), hafnium oxide ($HfO_2$), or zinc oxide ($ZnO_2$). The fourth insulating layer 115 may have a single layer or multi-layered structure including the above-described inorganic insulating materials. Another gate electrode may be disposed on the fourth insulating layer 115. However, the present invention is not limited thereto.

When the first insulating layer 112, the second insulating layer 113, the third insulating layer 114, the fourth insulating layer 115 and the fifth insulating layer 116 are collectively referred to as an inorganic insulating layer IL, the inorganic insulating layer IL may have a second hole H2 corresponding to the transmission area TA. The second hole H2 may expose a part of an upper surface of the substrate 100. In addition, when the buffer layer 111 is disposed in the transmission area TA, the second hole H2 may also expose a part of the upper surface of the buffer layer 111. An opening of the first insulating layer 112, an opening of the second insulating layer 113, an opening of the third insulating layer 114, an opening of the fourth insulating layer 115, and an opening of the fifth insulating layer 116, which are formed to correspond to the transmission area TA, may overlap each other so that the second hole H2 may be formed. For example, the inner surfaces of the openings of the insulating layers 112 through 115 may form inclined surfaces. These openings may be respectively formed in additional processes, or may be simultaneously formed in the same process. For example, when these openings are formed in additional processes, the inner surface of the second hole H2 might not be smooth and may have a step height like a step shape.

A main source electrode Sm, a main drain electrode Dm, an auxiliary source electrode Sa, and an auxiliary drain electrode Da may be arranged on the fifth insulating layer 116. The main source electrode Sm, the main drain electrode Dm, the auxiliary source electrode Sa, and the auxiliary drain electrode Da may include a conductive material including, for example, Mo, Al, Cu, and Ti, and may have a single layer or multi-layered structure including the above-described materials. In an example, the main source electrode Sm, the main drain electrode Dm, the auxiliary source electrode Sa, and the auxiliary drain electrode Da may have a multi-layered structure of Ti/Al/Ti.

A first planarization layer 117 may be disposed to cover the main source electrode Sm, the main drain electrode Dm, the auxiliary source electrode Sa, and an auxiliary drain electrode Da. A via hole for exposing one of the main source electrode Sm or the main drain electrode Dm of the main TFTm may be provided in the first planarization layer 117, and a via hole for exposing one of the auxiliary source electrode Sa or the auxiliary drain electrode Da of the auxiliary thin-film transistor TFT'.

A second planarization layer 118 may be disposed on the first planarization layer 117. The second planarization layer 118 may have a flat upper surface so that a main pixel electrode 210 and an auxiliary pixel electrode 210' disposed on the second planarization layer 118 may be flatly formed. Since a conductive pattern such as a wiring or the like may be formed between the first planarization layer 117 and the second planarization layer 118, integration may be increased.

In an embodiment of the present invention, the first planarization layer 117 and the second planarization layer 118 may be arranged in the transmission area TA. The first planarization layer 117 and the second planarization layer 118 may be provided on the transmission area TA to cover the first hole H1, which is defined by the bottom metal layer BML, and the second hole H2, which is defined by the inorganic insulating layer IL.

The first planarization layer 117 and the second planarization layer 118 may each include a general common use polymer such as Benzocyclobutene (BCB), polyimide, hexamethyldisiloxane (HMDSO), polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, or a vinyl alchohol-based polymer, or the like. The first planarization layer 117 and the second planarization layer 118 may each include an inorganic insulating material such as silicon oxide ($SiO_2$), silicon nitride (SiNx), silicon oxynitride (SiOXNY), aluminum oxide ($Al_2O_3$), titanium oxide ($TiO_2$), tantalum oxide ($Ta_2O_5$), hafnium oxide ($HfO_2$), or zinc oxide ($ZnO_2$). For example, the first planarization layer 117 and the second planarization layer 118 may each include a transparent material. When the first planarization layer 117 and the second planarization layer 118 are formed, to provide flat upper surfaces after layers are formed, chemical mechanical polishing may be performed on upper surfaces of the layers.

A via hole for exposing the via hole of the first planarization layer 117 that exposes one of the main source electrode Sm or the main drain electrode Dm of the main TFTm may be provided in the second planarization layer 118, and a via hole for exposing the via hole of the first planarization layer 117 that exposes one of the auxiliary source electrode Sa or the auxiliary drain electrode Da of the auxiliary thin-film transistor TFT' may be provided in the second planarization layer 118.

A main OLED and an auxiliary OLED' may be arranged on the first planarization layer 117 and the second planarization layer 118. A main pixel electrode 210 of the main OLED may be in contact with the main source electrode Sm or the main drain electrode Dm through the via holes provided in the first planarization layer 117 and the second planarization layer 118 and may be electrically connected to the main TFT. An auxiliary pixel electrode 210' of the auxiliary OLED' may be in contact with the auxiliary source electrode Sa or the auxiliary drain electrode Da through the via holes provided in the first planarization layer 117 and the second planarization layer 118 and may be electrically connected to the auxiliary TFT'.

The main pixel electrode 210 may be arranged on the second planarization layer 118 of the main display area MDA, and the auxiliary pixel electrode 210' may be arranged on the second planarization layer 118 of the component area CA.

The main pixel electrode 210 and the auxiliary pixel electrode 210' may include a conductive oxide such as indium tin oxide (ITO), indium zinc oxide (IZO), zinc oxide (ZnO), indium oxide ($In_2O_3$), indium gallium oxide (IGO) or aluminum zinc oxide (AZO). The main pixel electrode 210 and the auxiliary pixel electrode 210' may include a reflective layer including Ag, Mg, Al, Pt, Pd, Au, Ni, Nd, Ir, Cr, or a compound thereof. For example, the main pixel electrode 210 and the auxiliary pixel electrode 210' may have a structure with layers formed as ITO, IZO, ZnO or $In_2O_3$ on/under the above-described reflective layer. In this case, the main pixel electrode 210 and the auxiliary pixel electrode 210' may have a stack structure of ITO/Ag/ITO.

A pixel-defining layer 119 may cover edges of each of the main pixel electrode 210 and the auxiliary pixel electrode 210' that are disposed on the second planarization layer 118, and may have a first opening OP1 and a second opening OP2 for exposing at least a portion of the main pixel electrode 210 and the auxiliary pixel electrode 210', respectively. The size and shape of a light-emitting region of the main OLED, i.e., the main sub-pixels Pm may be defined by the first opening OP1. In addition, the size and shape of a light-emitting region of the auxiliary OLED', i.e., the auxiliary sub-pixels Pa may be defined by the second opening OP2.

The pixel-defining layer 119 may be configured to increase a distance between edges of the main pixel electrode 210 and the opposite electrode 230 on the main pixel electrode 210 to prevent arc from occurring in the edges of the main pixel electrode 210. In addition, the pixel-defining layer 119 may be configured to increase a distance between edges of the auxiliary pixel electrode 210' and the opposite electrode 230 on the auxiliary pixel electrode 210' to prevent arc from occurring in the edges of the auxiliary pixel electrode 210'.

The pixel-defining layer 119 may be formed of an organic insulating material such as polyimide, polyamide, acryl resin, BCB, HMDSO, a phenol resin, or the like through a method such as spin coating or the like.

A main light-emitting layer 220*b* may be disposed inside the first opening OP1 for exposing at least a portion of the main pixel electrode 210, and an auxiliary light-emitting layer 220*b*' may be disposed inside the second opening OP2 for exposing at least a portion of the auxiliary pixel electrode 210'. The main light-emitting layer 220*b* and the auxiliary light-emitting layer 210*b*' may include a polymer material or a low molecular material and may emit red, green, blue or white light.

An organic functional layer 220*e* may be disposed on and/or under the main light-emitting layer 220*b* and the auxiliary light-emitting layer 220*b*'. The organic functional layer 220*e* may include a first functional layer 220*a* and/or a second functional layer 220*c*. The first functional layer 220*a* or the second functional layer 220*c* may be omittable.

The first functional layer 220*a* may be disposed under the main light-emitting layer 220*b* and the auxiliary light-emitting layer 220*b*'. The first functional layer 220*a* may have a single layer or multi-layered structure including an organic material. The first functional layer 220*a* may be a hole transport layer (HTL) having a single layer structure. In addition, the first functional layer 220*a* may include a hole injection layer (HIL) and a HTL. The first functional layer 220*a* may be integrally formed to correspond to the main OLED included in the main display area MDA and the auxiliary OLED' included in the component area CA.

The second functional layer 220*c* may be disposed on the main light-emitting layer 220*b* and the auxiliary light-emitting layer 220*b*'. The second functional layer 220*c* may have a single layer or multi-layered structure including an organic material. The second functional layer 220*c* may include an electron transport layer (ETL) and/or an electron injection layer (EIL). The second functional layer 220*c* may be integrally formed to correspond to the main OLED included in the main display area MDA and the auxiliary OLED' included in the component area CA.

The opposite electrode 230 may be disposed on the second functional layer 220*c*. The opposite electrode 230 may include a conductive material having a low work function. For example, the opposite electrode 230 may include a (semi-)transparent layer including Ag, Mg, Al, Pt, Pd, Au, Ni, Nd, Ir, Cr, Li, Ca or an alloy thereof. In addition, the opposite electrode 230 may further include a layer such as ITO, IZO, ZnO or $In_2O_3$ on the (semi-)transparent layer including the above-described materials. The opposite electrode 230 may be formed to correspond to the main OLED included in the main display area MDA and the auxiliary OLED' included in the component area CA.

Layers from the main pixel electrode 210 formed in the main display area MDA to the opposite electrode 230 may constitute the main OLED. Layers from the auxiliary pixel electrode 210' formed in the component area CA to the opposite electrode 230 may constitute the auxiliary OLED'.

An upper layer 250 including an organic material may be disposed on the opposite electrode 230. The upper layer 250 may be a layer provided to protect the opposite electrode 230 and simultaneously to increase light extraction efficiency. The upper layer 250 may include an organic material having a higher refractive index than that of the opposite electrode 230. In addition, the upper layer 250 may be provided by stacking layers having different refractive indexes. For example, the upper layer 250 may be provided by stacking a high refractive index layer/a low refractive index layer/a high refractive index layer. In this case, the refractive index of the high refractive index layer may be greater than or equal to about 1.7, and the refractive index of the low refractive index layer may be less than or equal to about 1.3. The upper layer 250 may further include lithium fluoride (LiF). In addition, the upper layer 250 may further include an inorganic insulating material such as silicon oxide ($SiO_2$), silicon nitride (SINx), or silicon oxynitride (SiOXNY). In an embodiment, the upper layer 250 may be omittable.

The organic functional layer 220*e*, the opposite electrode 230, and the upper layer 250 might not be arranged in the transmission area TA. For example, the organic functional layer 220*e*, the opposite electrode 230, and the upper layer 250 may be patterned using a FMM mask or the like. In addition, the organic functional layer 220*e*, the opposite electrode 230, and the upper layer 250 formed in a portion corresponding to the transmission area TA may be removed by using laser lift off after materials for forming the organic functional layer 220*e*, the opposite electrode 230 and the upper layer 250 are formed on the entire surface of the substrate 100. Thus, the organic functional layer 220*e*, the opposite electrode 230, and the upper layer 250 might not be arranged in the transmission area TA. Thus, light transmittance in the transmission area TA may be remarkably increased.

The main OLED and the auxiliary OLED' may be sealed by the thin-film encapsulation layer 300. The thin-film encapsulation layer 300 may be disposed on the upper layer 250. The thin-film encapsulation layer 300 may prevent external moisture or foreign substances from penetrating into the main OLED and the auxiliary OLED'.

The thin-film encapsulation layer 300 may include at least one inorganic encapsulation layer and at least one organic encapsulation layer, and in this regard, FIG. 4 illustrates a thin-film encapsulation layer 300 in which a first inorganic encapsulation layer 310, an organic encapsulation layer 320 and a second inorganic encapsulating layer 330 are stacked on each other. In an embodiment of the present invention, the number of organic encapsulation layers and the number and stack order of inorganic encapsulation layers may be changed.

The first inorganic encapsulation layer 310 and the second inorganic encapsulation layer 330 may include at least one, for example, of aluminum oxide, titanium oxide, tantalum oxide, hafnium oxide, zinc oxide, silicon oxide, silicon nitride, and silicon oxynitride through chemical vapor deposition (CVD) or the like. The organic encapsulation layer 320 may include a polymer-based material. The polymer-based material may include, for example, a silicon-based resin, an acryl-based resin, an epoxy-based resin, polyimide, polyethylene, or the like.

The first inorganic encapsulation layer 310, the organic encapsulation layer 320, and the second inorganic encapsulation layer 330 may be integrally provided to cover the main display area MDA and the component area CA. Thus, the first inorganic encapsulation layer 310, the organic encapsulation layer 320, and the second inorganic encapsulation layer 330 may be arranged on the second planarization layer 118 disposed in the transmission area TA.

In an embodiment of the present invention, the organic encapsulation layer 320 may be integrally formed to cover the main display area MDA and the component area CA, and might not be present in the transmission area TA. In other words, the organic encapsulation layer 320 may include an opening corresponding to the transmission area TA. In this case, the first inorganic encapsulation layer 310 and the second inorganic encapsulation layer 330 may be in contact with each other in the transmission area TA.

Figure 5:
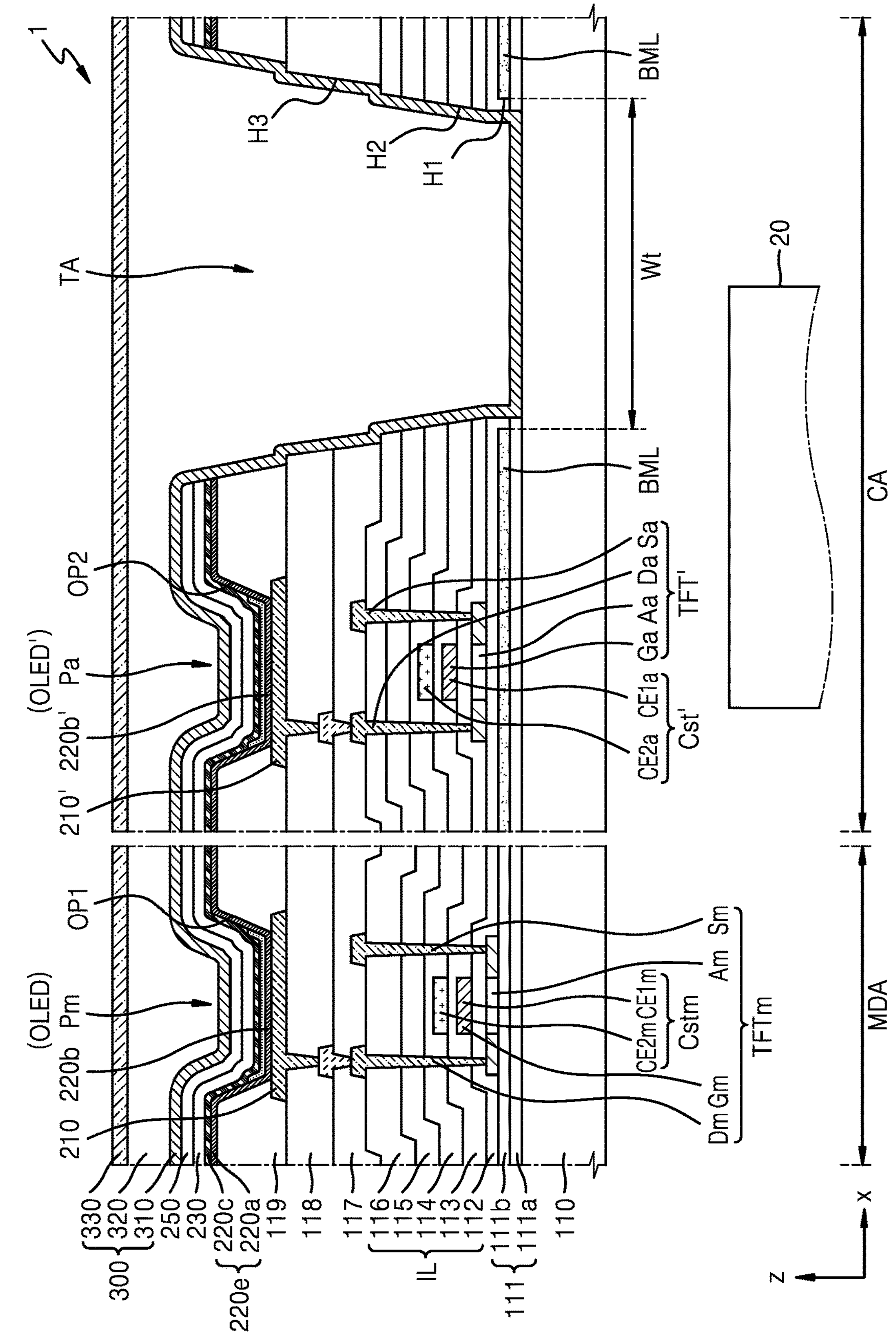
FIG. 5 is a cross-sectional view schematically illustrating a display device according to an embodiment of the present invention.

FIG. 5 is a cross-sectional view schematically illustrating a display device according to an embodiment of the present invention. In FIG. 5, the same reference numerals as those of FIG. 4 refer to the same elements, and thus, redundant descriptions thereof may be omitted or briefly discussed, and differences therebetween will be described.

Referring to FIG. 5, the first planarization layer 117 and the second planarization layer 118 may have a third hole H3 corresponding to the transmission area TA. The third hole H3 may overlap the second hole H2. In FIG. 5, the third hole H3 is greater than the second hole H2. However, the present invention is not limited thereto. The first planarization layer 117 and/or the second planarization layer 118 may be provided to cover edges of the second hole H2 of the inorganic insulating layer IL, so that the area of the third hole H3 may also be less than the area of the second hole H2.

In an embodiment of the present invention, in the transmission area TA, the first inorganic encapsulation layer 310 of the thin-film encapsulation layer 300 may be directly disposed on the substrate 100. In an embodiment of the present invention, when the first buffer layer 111*a* is not removed in response to the transmission area TA, in the transmission area TA, the first inorganic encapsulation layer 310 of the thin-film encapsulation layer 300 may be disposed on the first buffer layer 111*a*.

In addition, when the organic encapsulation layer 320 is integrally formed to cover the main display area MDA and the component area CA and is not present in the transmission area TA, the first inorganic encapsulation layer 310 and the second inorganic encapsulation layer 330 may be in contact with each other in the transmission area TA.

Figure 6:
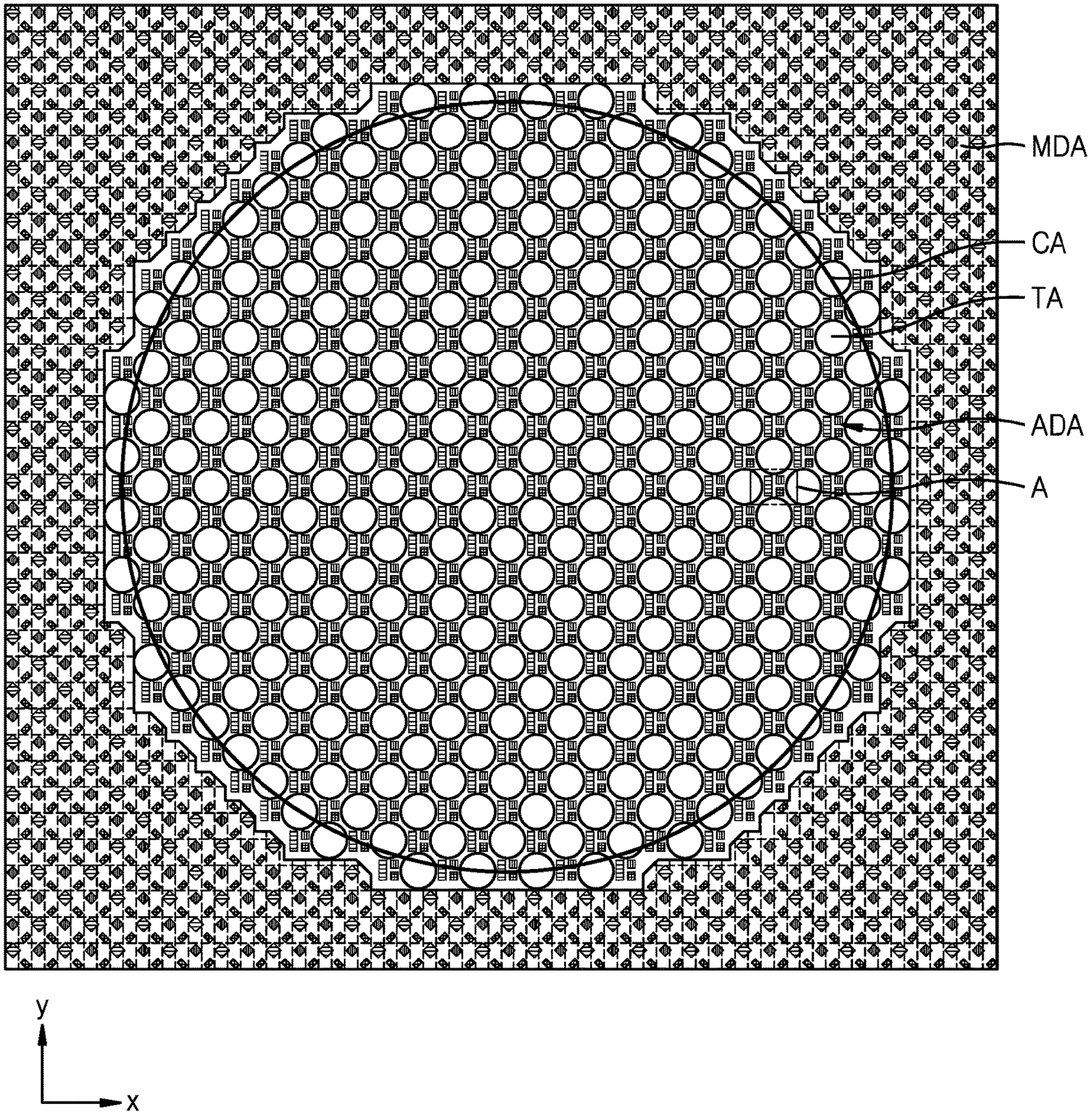
FIG. 6 is a schematic plan view of a main display area and a component area of a display device according to an embodiment of the present invention.

FIG. 6 schematically illustrates a plan view of the main display area MDA and the component area CA of a display device according to an embodiment of the present invention.

Referring to FIG. 6, the main display area MDA may be an area in which main sub-pixels (see Pm of FIG. 1) are arranged, and the auxiliary display area ADA may be an area in which auxiliary sub-pixels (see Pa of FIG. 1) are arranged. In other words, the main display area MDA may be an area in which main OLEDs (see FIG. 4) are disposed, and the auxiliary display area ADA may be an area in which auxiliary OLED' (see FIG. 4) are disposed.

In an embodiment of the present invention, the component area CA may include an auxiliary display area ADA and a transmission area TA. The auxiliary display area ADA and the transmission area TA may be alternately disposed. The auxiliary display areas ADA may be disposed between the transmission areas TA. The transmission areas TA may be adjacent to each other in an x direction and an −x direction of the auxiliary display area ADA. In addition, the transmission areas TA may be adjacent to each other in a y direction and a −y direction of the auxiliary display area ADA. In other words, the transmission areas TA may be in a portion adjacent to the auxiliary display area ADA in the first direction (e.g., x direction or −x direction) and a portion adjacent to the auxiliary display area ADA in the second direction (e.g., y direction or −y direction).

The transmission area TA may be between the auxiliary display areas ADA. The auxiliary display areas ADA may be adjacent to each other in an x direction and an −x direction of the transmission area TA. In addition, the auxiliary display areas ADA may be adjacent to each other in a y direction and a −y direction of the transmission area TA. In other words, the auxiliary display areas ADA may be in a portion adjacent to the auxiliary display area ADA in the first direction (e.g., x direction or −x direction) and a portion adjacent to the auxiliary display area ADA in the second direction (e.g., y direction or −y direction). FIG. 6 illustrates that the transmission area TA has a circular shape. However, the present invention is not limited thereto. The transmission area TA may have a polygonal shape.

Red, green, blue sub-pixels may be arranged in the main display area MDA and the auxiliary display area ADA of the component area CA. The red, green, and blue sub-pixels arranged in the main display area MDA may be main sub-pixels Pm. In addition, the red, green, and blue sub-pixels arranged in the auxiliary display area ADA of the component area CA may be auxiliary sub-pixels Pa. The arrangement of the red, green, and blue sub-pixels arranged in the main display area MDA may be the same as or different from the arrangement of the red, green, and blue sub-pixels in the auxiliary display area ADA. In an embodiment of the present invention, FIG. 6 illustrates that the arrangement of the sub-pixels Pm of the main display area MDA and the arrangement of the sub-pixels Pa of the auxiliary display area ADA are different from each other.

In an embodiment of the present invention, the auxiliary display area ADA of the component area CA may include one red, green, blue sub-pixels, respectively. The red, green, and blue sub-pixels in the auxiliary display area ADA may have rectangular or square shapes. However, the present invention is not limited thereto. For example, the red, green, and blue sub-pixels in the auxiliary display area ADA may have circular or polygonal shapes. The auxiliary display area ADA may be between the transmission areas TA that are spaced apart from each other in a first direction (e.g., x direction or −x direction). The blue sub-pixels in the auxiliary display area ADA may be disposed adjacent to the transmission area TA at one side. The green and red sub-pixels in the auxiliary display area ADA may be disposed adjacent to the transmission area TA at the other side.

A length in a second direction (e.g., a y direction or a −y direction) of the blue sub-pixels in the auxiliary display area ADA may be greater than a length in the second direction (e.g., a y direction or a −y direction) of the red and green sub-pixels. The size of the blue sub-pixels in the auxiliary display area ADA may be greater than the sizes of the red and green sub-pixels. The size of the blue sub-pixels in the auxiliary display area ADA may be greater than the sum of the sizes of the red and green sub-pixels.

In one embodiment of the present invention, bypass lines (see HL and VL of FIG. 7A) passing between the transmission areas TA may be arranged while being electrically connected to the auxiliary sub-pixel circuit in the auxiliary display area ADA. The bypass lines (see HL and VL of FIG. 7A) may include a first bypass line HL and a second bypass line VL. The first bypass line HL may extend in a direction of a diagonal line in the first direction (e.g., x direction or −x direction) and in the second direction (e.g., y direction or −y direction). The second bypass line VL may extend in a direction crossing a direction in which the first bypass line HL extends. However, the present invention is not limited thereto. The first bypass line HL may extend in the x direction, and the second bypass line VL may extend in the y direction.

Signal lines, a first initialization voltage line, a second initialization voltage line, and a driving voltage line for applying an electrical signal to auxiliary sub-pixel circuits for driving sub-pixels in the auxiliary display area ADA may be arranged in the first bypass line HL and the second bypass line VL. In this case, the signal lines may include a data line, a first scan line, a second scan line, a third scan line, a fourth scan line, and an emission control line.

In an embodiment of the present invention, the first bypass line HL may be at least one of the first scan line, the second scan line, the third scan line, the fourth scan line, an emission control line, a first initialization voltage line, or a second initialization voltage line, and the second bypass line VL may be at least one of the data line or the driving voltage line.

Figure 7A:
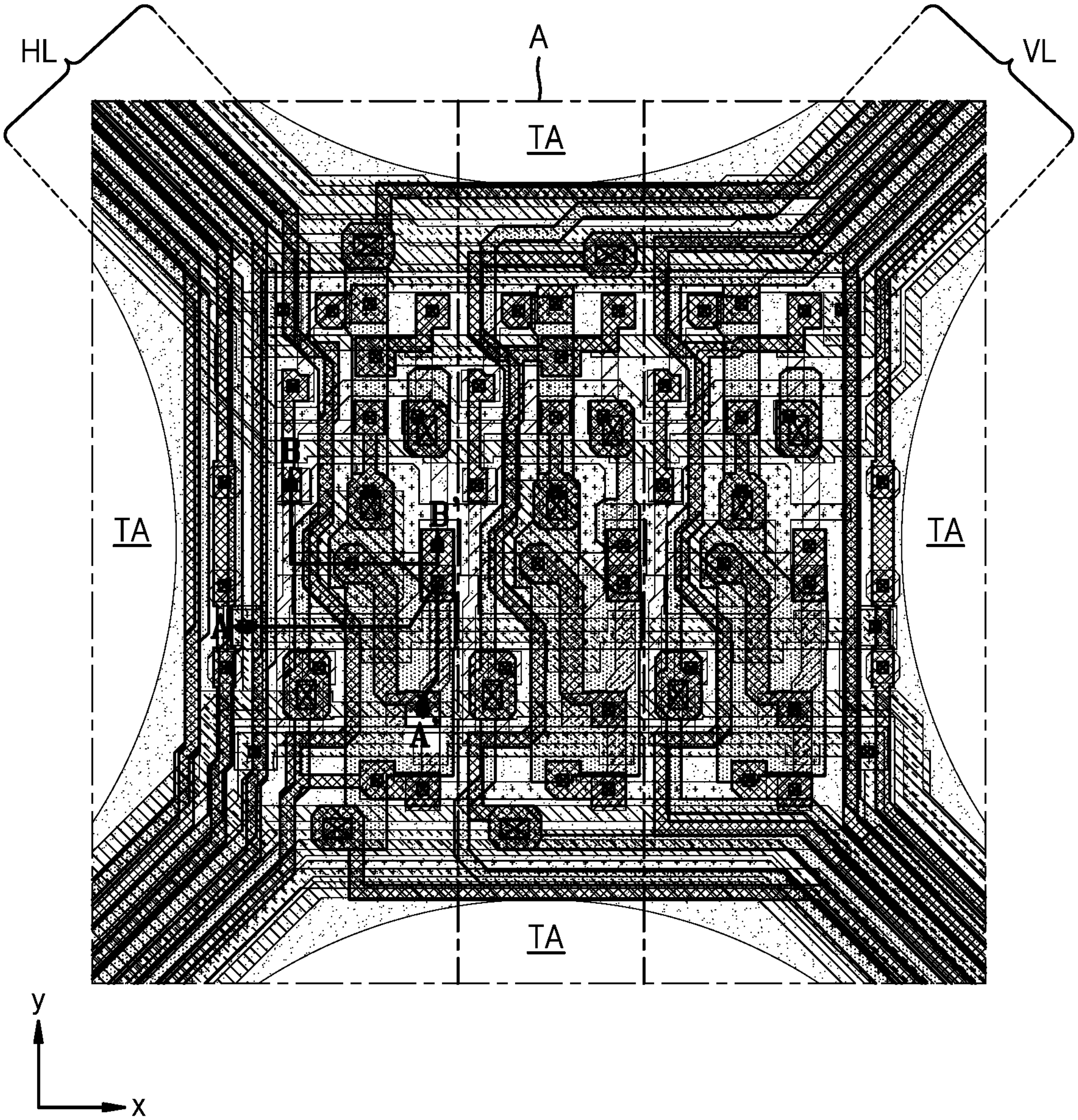
FIGS. 7A and 7B are views schematically illustrating positions of a plurality of thin-film transistors and capacitors arranged in pixel circuits of a display device, according to an embodiment of the present invention.
Figure 7B:
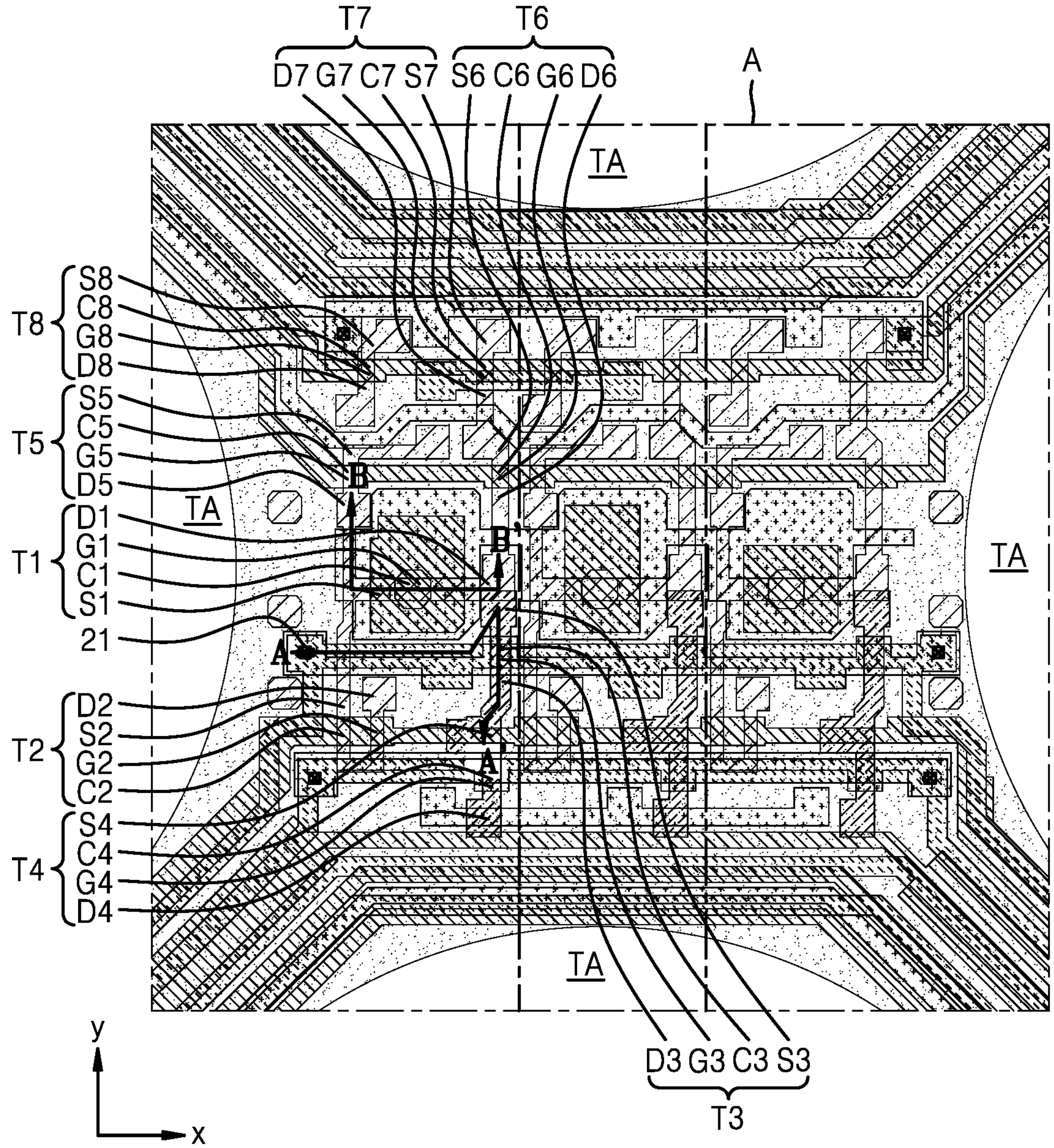

FIGS. 7A and 7B are views schematically illustrating positions of a plurality of thin-film transistors and capacitors arranged in pixel circuits of a display device according to an embodiment of the present invention. FIGS. 7A and 7B are schematic enlarged views of region A of FIG. 6.

FIGS. 8 through 15 are cross-sectional views schematically illustrating elements of FIGS. 7A and 7B according to layers.

Referring to FIGS. 7A and 7B, three auxiliary sub-pixel circuits arranged in the same row in adjacent columns are illustrated. FIG. 7A schematically illustrates positions of a plurality of thin-film transistors and capacitors arranged in auxiliary sub-pixel circuits up to a layer including a third gate electrode (see G3*b* of FIG. 16) of a third transistor (see T3 of FIG. 16), and FIG. 7B schematically illustrates positions of a plurality of thin-film transistors and capacitors disposed in auxiliary sub-pixel circuits up to a layer including a third gate electrode (see G3*b* of FIG. 16) of the third transistor (see T3 of FIG. 16), a first connection electrode (see CM1 of FIG. 16) and a third connection electrode (see CM2 of FIG. 16) including a source electrode and a drain electrode on an upper portion of the third gate electrode G3*b* (see T3 of FIG. 16).

Referring to FIGS. 7A and 7B, the auxiliary sub-pixel circuit may include a first transistor T1, a second transistor T2, a third transistor T3, a fourth transistor T4, a fifth transistor T5, a sixth transistor T6, a seventh transistor T7, an eighth transistor T8, and a storage capacitor Cst.

In an embodiment of the present invention, each of the first transistor T1, the second transistor T2, the fifth transistor T5, the sixth transistor T6, the seventh transistor T7, and the eighth transistor T8 may be provided as a transistor including a silicon semiconductor. The third transistor T3 and the fourth transistor T4 may be provided as a transistor including an oxide semiconductor.

Figure 8:
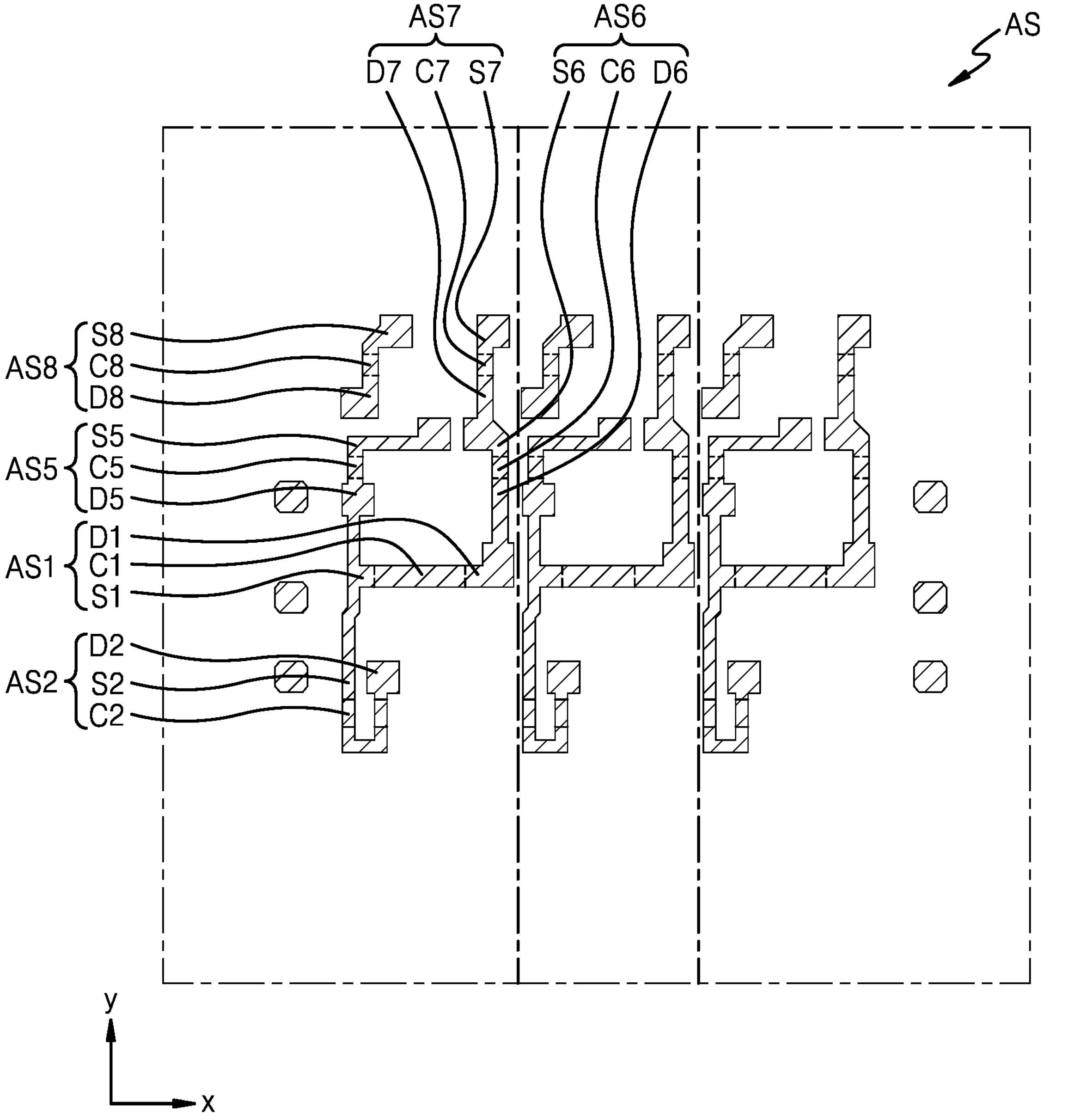
FIGS. 8 through 15 are cross-sectional views schematically illustrating elements of FIGS. 7A and 7B according to layers of the present invention.

Referring to FIG. 8, a semiconductor layer AS of each of the first transistor T1, the second transistor T2, the fifth transistor T5, the sixth transistor T6, the seventh transistor T7, and the eighth transistor T8 may be arranged in the same layer for each of the transistors T1 through T8 and may include the same material for each of the transistors T1 through T8. For example, the semiconductor layer AS may include polycrystalline silicon. The semiconductor layer AS of each of the first transistor T1, the second transistor T2, the fifth transistor T5, the sixth transistor T6, the seventh transistor T7, and the eighth transistor T8 may be connected to each other and may be bent in various shapes.

The semiconductor layer AS of the first transistor T1, the second transistor T2, the fifth transistor T5, the seventh transistor T6, the seventh transistor T7, and the eighth transistor T8 may include a channel region C, and a source region S and a drain region D at both sides of the channel region C. In an example, the source region S and the drain region D may be doped with impurities, and the impurities may include N-type impurities or P-type impurities. The source region S and the drain region D may be electrically connected to the source electrode and the drain electrode, respectively. The source region S and the drain region D may be changed according to characteristics of the transistor.

Figure 10:
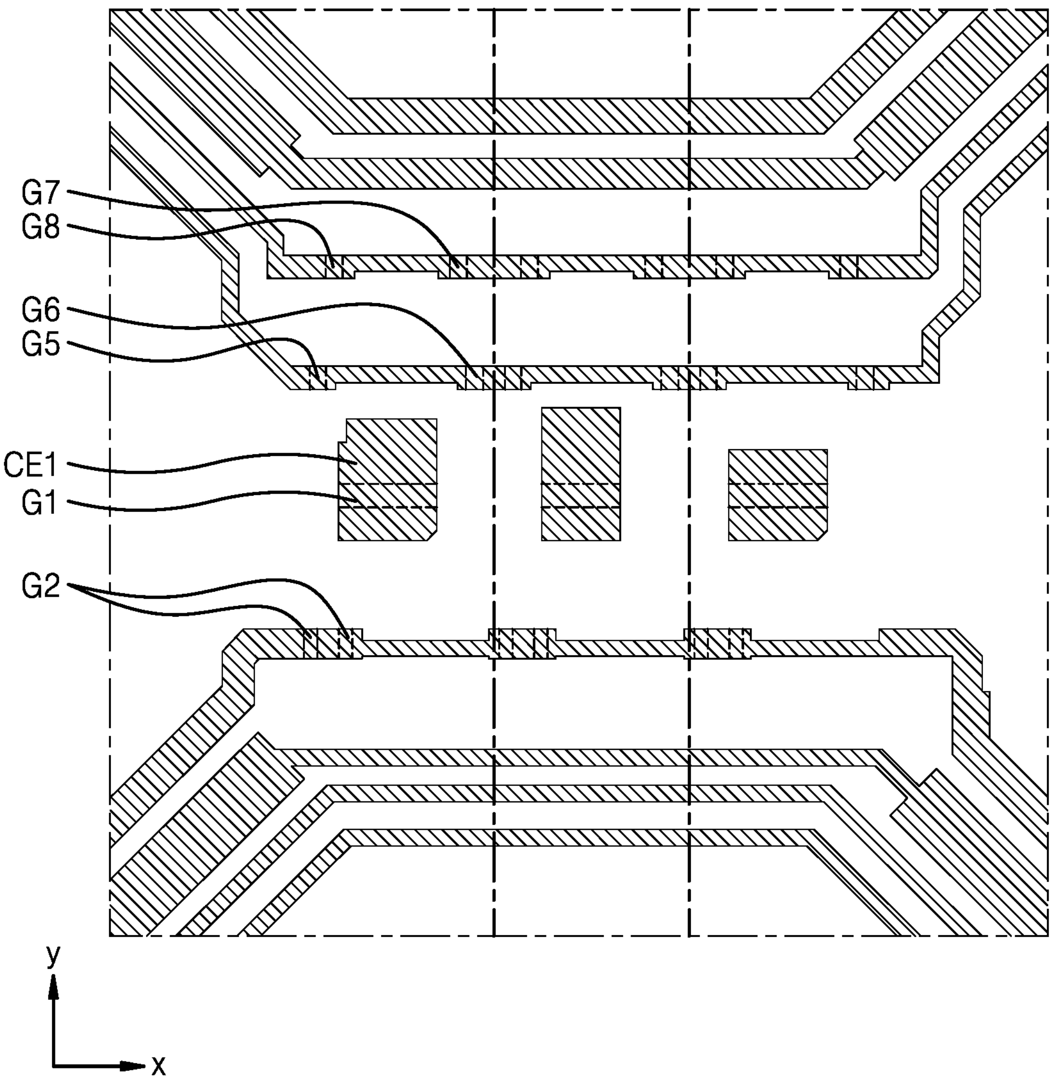

Referring to FIGS. 8 and 10, the first transistor T1 may include a first semiconductor layer AS1 and a first gate electrode G1. The first semiconductor layer AS1 may include a first channel region C1, and a first source region S1 and a first drain region D1 at both sides of the first channel region C1. The first semiconductor layer AS1 may have a bent shape so that the first channel region C1 may be formed to be longer than the other channel regions C2 to C7. The first gate electrode G1 may be of an island type and may overlap the first channel region C1 with a first insulating layer (see 112 of FIG. 17) therebetween.

The storage capacitor Cst may be disposed to overlap the first transistor T1. The storage capacitor Cst may include a first electrode CE1 and a second electrode CE2. The first gate electrode G1 may function as a control electrode of the first transistor T1 and also as the first electrode CE1 of the storage capacitor Cst. For example, the first gate electrode G1 and the first electrode CE1 may be integrally formed. The second electrode CE2 of the storage capacitor Cst may be provided to overlap the first electrode CE1 with a second insulating layer (see 113 of FIG. 17). In this case, the second insulating layer (see 113 of FIG. 17) may be a dielectric layer of the storage capacitor Cst. The second electrode CE2 of the storage capacitor Cst may be located on the same layer as the third gate electrode G3 of the third transistor T3 and the fourth gate electrode G4 of the fourth transistor T4, and may include the same material as each of the third gate electrode G3 and the fourth gate electrode G4.

The second transistor T2 may include a second semiconductor layer AS2 and a second gate electrode G2. The second semiconductor layer AS2 may include a second channel region C2, and a second source region S2 and a second drain region D2 at both sides of the second channel region C2. The source region S2 of the second transistor T2 may be connected to the first source region S1 of the first transistor T1. However, the present invention is not limited thereto.

The fifth transistor T5 may include a fifth semiconductor layer AS5 and a fifth gate electrode G5. The fifth semiconductor layer AS5 may include a fifth channel region C5, and a fifth source region S5 and a fifth drain region D5 at both sides of the fifth channel region C5. The fifth drain region D5 of the fifth transistor T5 may be connected to the first source region S1 of the first transistor T1. However, the present invention is not limited thereto.

The sixth transistor T6 may include a sixth semiconductor layer AS6 and a sixth gate electrode G6. The sixth semiconductor layer AS6 may include a sixth channel region C6, and a sixth source region S6 and a sixth drain region D6 at both sides of the sixth channel region C6. The sixth drain region D6 of the sixth transistor T6 may be connected to the first drain region D1 of the first transistor T1. However, the present invention is not limited thereto.

The seventh transistor T7 may include a seventh semiconductor layer AS7 and a seventh gate electrode G7. The seventh semiconductor layer AS7 may include a seventh channel region C7, and a seventh source region S7 and a seventh drain region D7 at both sides of the seventh channel region C7. The seventh drain region D7 of the seventh transistor T7 may be connected to the sixth source region S6 of the sixth transistor T6.

The eighth transistor T8 may include an eighth semiconductor layer AS8 and an eighth gate electrode G8. The eighth semiconductor layer AS8 may include an eighth channel region C8, and an eighth source region S8 and an eighth drain region D8 at both sides of the eighth channel region C8. The eighth transistor T8 may be disposed to be isolated from the first through seventh transistors T1, T2, T3, T4, T5, T6, and T7.

Figure 17:
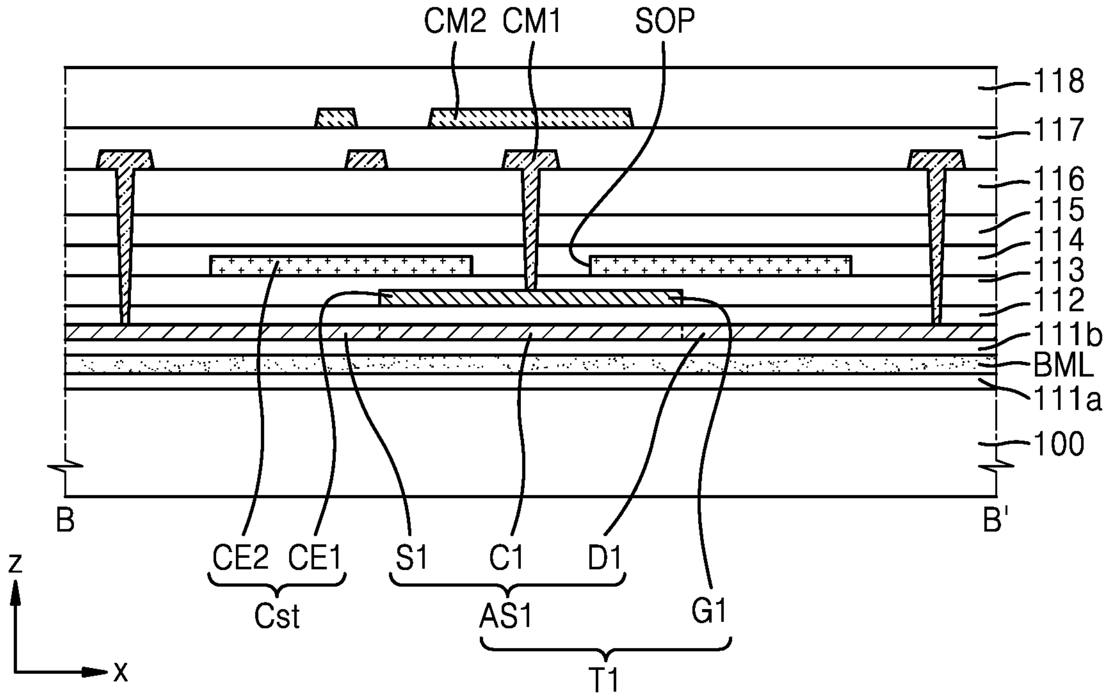
FIG. 17 is a schematic cross-sectional view of the display device taken along a line B-B' of FIGS. 7A and 7B of the present invention.

A second insulating layer (see 114 of FIG. 17) may be disposed on the first, the second, the fifth through seventh transistors T1, T2, T5, T6, and T7 each including a silicon semiconductor, and the third and fourth transistors T3 and T4 each including an oxide semiconductor may be disposed on the second insulating layer (see 114 of FIG. 17).

Figure 9:
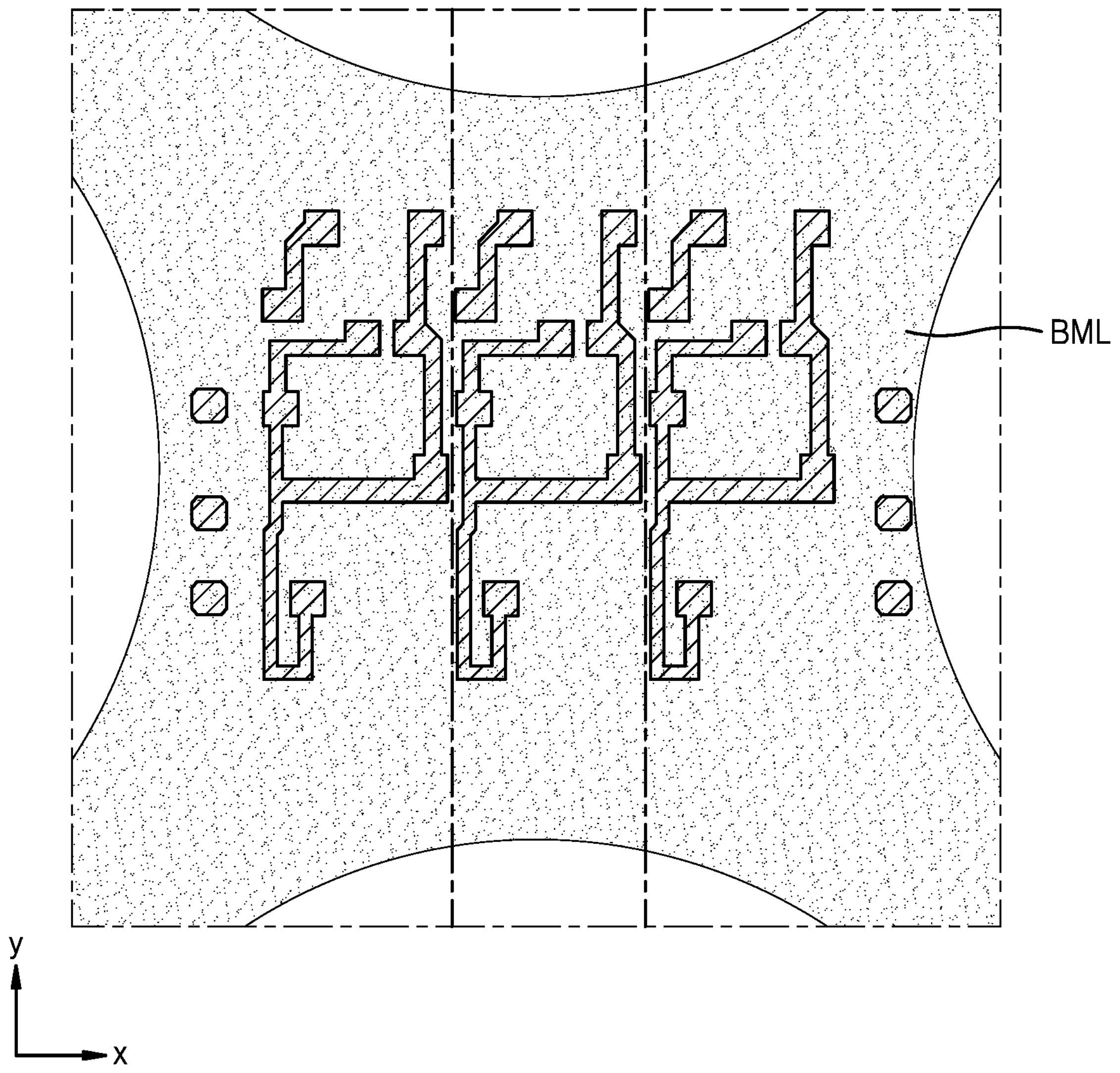

Referring to FIG. 9, a bottom metal layer BML may be disposed to overlap the auxiliary display area ADA. The bottom metal layer BML may prevent external light from reaching the auxiliary sub-pixels Pa that include the auxiliary TFT'. For example, the bottom metal layer BML may prevent light emitted from a component from reaching the auxiliary sub-pixels Pa.

In an embodiment of the present invention, the bottom metal layer BML may be disposed in the auxiliary display area ADA and at a boundary between the auxiliary display area ADA and the transmission area TA. Since the first bypass line (see HL of FIG. 7A) and the second bypass line (see VL of FIG. 7B) pass a boundary between the transmission area TA and the auxiliary display area ADA, the first bypass line HL and the second bypass line VL may overlap the bottom metal layer BML.

Figure 12:
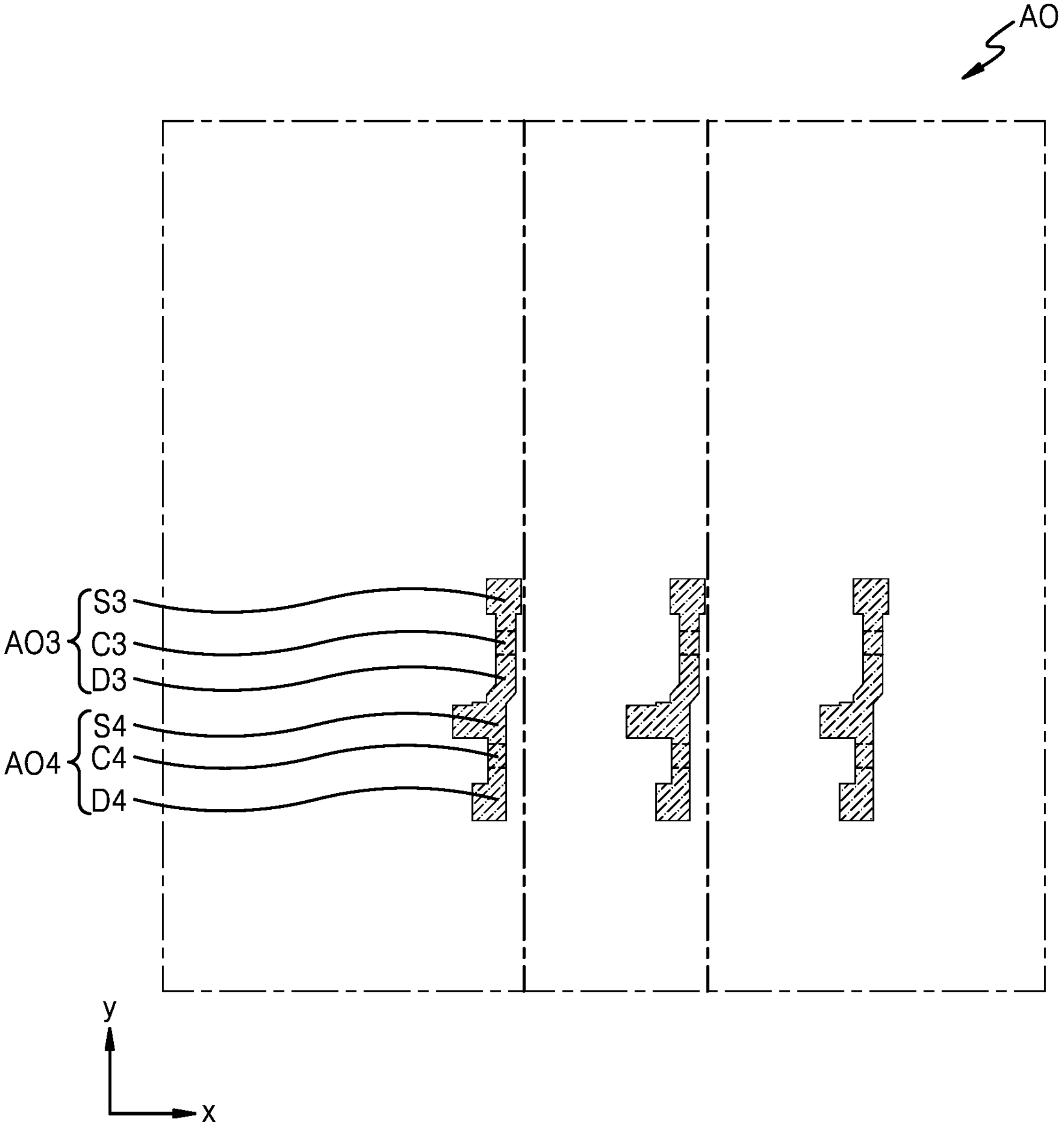
Figure 13:
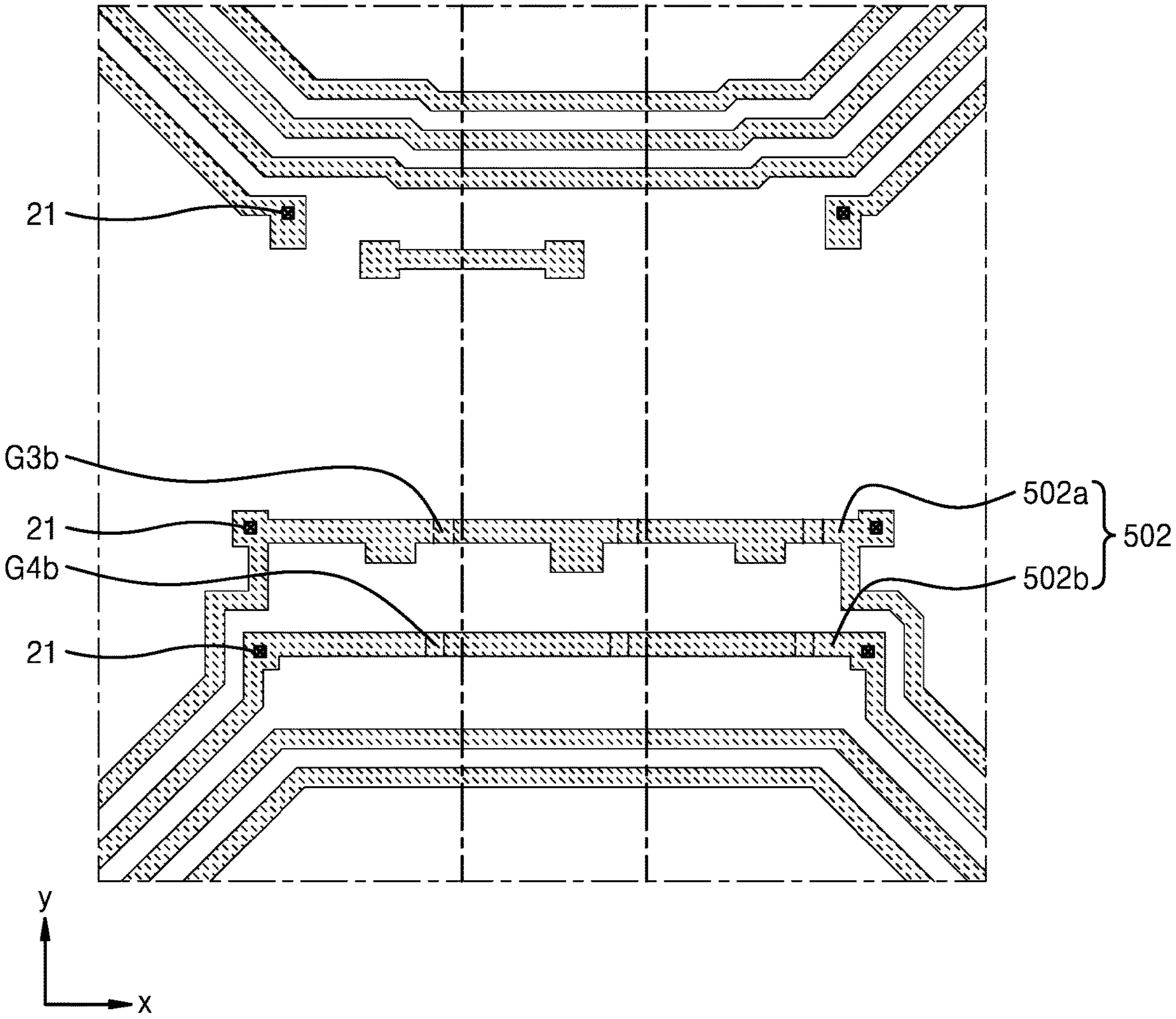

As illustrated in FIGS. 12 and 13, semiconductor layers AO of the third transistor T3 and the fourth transistor T4 may be arranged on the same layer as each other and may include the same material as each other. For example, the semiconductor layer AO may be formed as an oxide semiconductor.

The semiconductor layer AO may include a channel region C, and a source region S and a drain region D at both sides of the channel region C. In an example, the source region S and the drain region D may be regions in which carrier concentration is increased by plasma treatment. The source region S and the drain region D may be electrically connected to the source electrode and the drain electrode, respectively.

The third transistor T3 may include a third semiconductor layer AO3 and a third gate electrode G3*b* each including an oxide semiconductor. The third semiconductor layer AO3 may include a third channel region C3, and a third source region S3 and a third drain region D3 at both sides of the third channel region C3.

The fourth transistor T4 may include a fourth semiconductor layer AO4 and a fourth gate electrode G4*b* each including an oxide semiconductor. The fourth semiconductor layer G4*b* may include a fourth channel region C4, and a fourth source region S4 and a fourth drain region D4 at both sides of the fourth channel region C4. The third drain region D3 of the third transistor T3 may be connected to the fourth source region S4 of the fourth trasnsistor T4.

Figure 11:
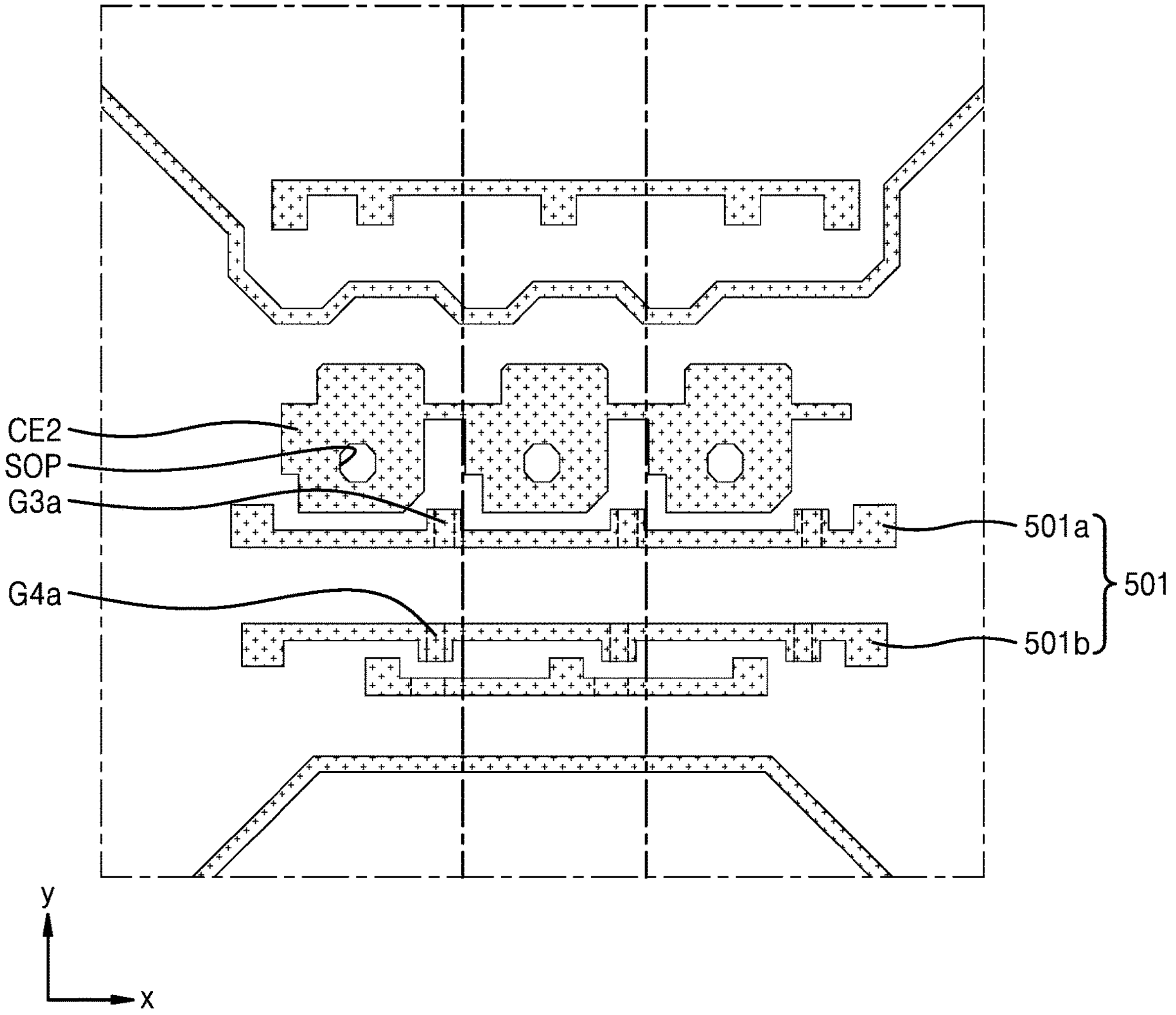
Figure 16:
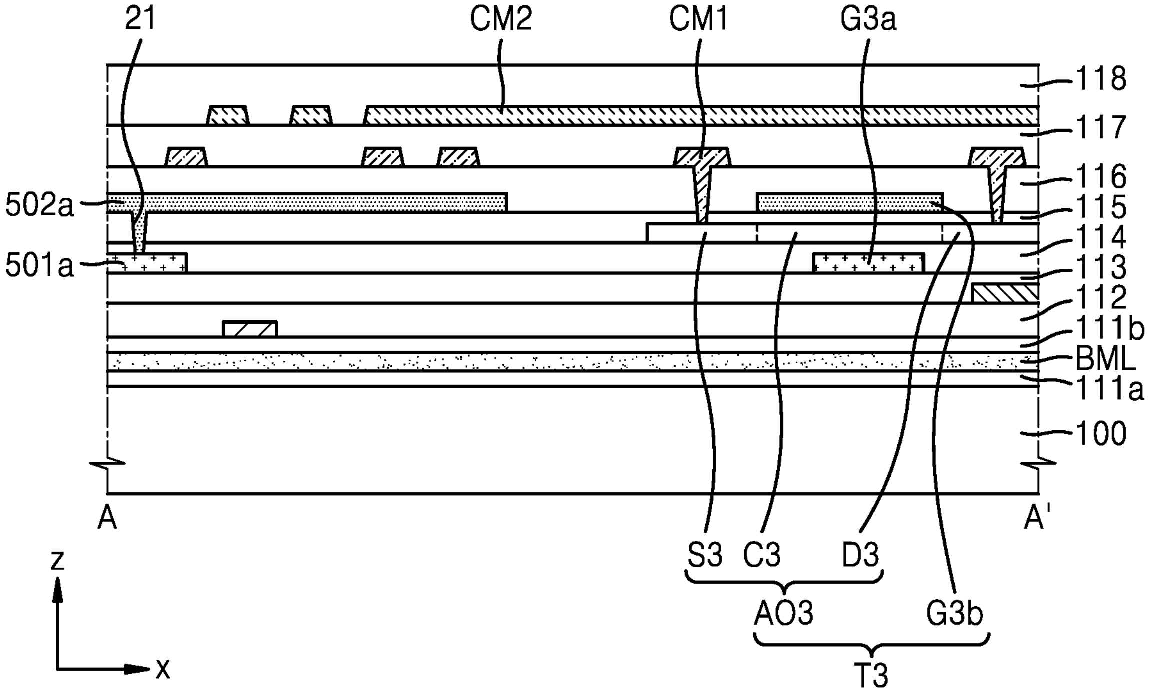
FIG. 16 is a schematic cross-sectional view of the display device taken along a line A-A' of FIGS. 7A and 7B of the present invention.

As shown in FIG. 11, a third lower gate electrode G3*a* of the third transistor T3 and a fourth lower gate electrode G4*a* of the fourth transistor T4 may be arranged on the second insulating layer (see 113 of FIG. 16). The third transistor T3 and the fourth transistor T4 may include the third lower gate electrode G3*a* and the fourth lower gate electrode G4*b* at lower portions of the third transistor T3 and the fourth transistor T4.

The third lower gate electrode G3*a* of the third transistor T3 and the fourth lower gate electrode G4*a* of the fourth transistor T4 may be located on the same layer as the second electrode CE2 of the storage capacitor Cst and may include the same material as the second electrode CE2. The second electrode CE2 of the storage capacitor Cst may include an opening SOP. The opening SOP may be formed by removing a portion of the second electrode CE2 and may have a closed shape.

A first wiring 501 may be disposed on a second insulating layer (see 113 of FIG. 16). The first wiring 501 may include a (1-1)-th wiring 501*a* and a (1-2)-th wiring 501*b*. The (1-1)-th wiring 501*a* may be integrally provided with the third lower gate electrode G3*a* of the third transistor T3. The (1-2)-th wiring 501*b* may be integrally provided with the fourth lower gate electrode G4*a* of the fourth transistor T4. The (1-1)-th wiring 501*a* and the (1-2)-th wiring 501*b* may be disposed on the same layer as the third lower gate electrode G3*a* of the third transistor T3 and the fourth lower gate electrode G4*a* of the fourth transistor T4 and may include the same material as each other.

The (1-1)-th wiring 501*a* and the (1-2)-th wiring 501*b* may extend in the first direction (e.g., x direction or −x direction). The (1-1)-th wiring 501*a* and the (1-2)-th wiring 501*b* may extend in the first direction (e.g., x direction or −x direction) in the auxiliary display area ADA. The (1-1)-th wiring 501*a* and the (1-2)-th wiring 501*b* may have an isolated shape in which they are disposed only within the auxiliary display area ADA of the component area CA in a plane view. In other words, the (1-1)-th wiring 501*a* and the (1-2)-th wiring 501*b* might not be disposed in the transmission area TA. The (1-1)-th wiring 501*a* and the (1-2)-th wiring 501*b* might not be connected to the bypass wirings (see HL and VL of FIG. 7A) extending with the transmission area TA therebetween but may be disposed within the auxiliary display area ADA. For example, the (1-1)-th wiring 501*a* and the (1-2)-th wiring 501*b*.

Referring to FIG. 13, a second wiring 502 may be disposed on a fourth insulating layer (see 115 of FIG. 16). The second wiring 502 may include a (2-1)-th wiring 502*a* and a (2-2)-th wiring 502*b*. The (2-1)-th wiring 502*a* may be integrally provided with the third lower gate electrode G3*b* of the third transistor T3. The (2-2)-th wiring 502*b* may be integrally provided with the fourth lower gate electrode G4*b* of the fourth transistor T4. The (2-1)-th wiring 502*a* and the (2-2)-th wiring 502*b* may be disposed on the same layer as the third lower gate electrode G3*b* of the third transistor T3 and the fourth lower gate electrode G4*b* of the fourth transistor T4 and may include the same material as each other.

The (2-1)-th wiring 502*a* and the (2-2)-th wiring 502*b* may extend in the first direction (e.g., x direction or −x direction). The (2-1)-th wiring 502*a* and the (2-2)-th wiring 502*b* may extend in the first direction (e.g., x direction or −x direction) in the auxiliary display area ADA. The (2-1)-th wiring 502*a* and the (2-2)-th wiring 502*b* may be disposed with the transmission area TA therebetween, and may include bypass wirings for transmitting electrical signals to auxiliary sub-pixels. In other words, the (2-1)-th wiring 502*a* and the (2-2)-th wiring 502*b* may be electrically connected to the bypass wiring (see HL and VL of FIG. 7A) for transmitting signals to the auxiliary sub-pixels (see Pa of FIG. 1).

In an embodiment of the present invention, referring to FIGS. 11 and 13, the first wiring 501 and the second wiring 502 may overlap each other in the first direction (e.g., x direction or −x direction). In other words, the first wiring 501 and the second wiring 502 may overlap each other in the first direction (e.g., z direction or −z direction) with the third insulating layer (see 114 of FIG. 16) and the fourth insulating layer (see 115 of FIG. 16) disposed therebetween. For example, the (1-1)-th wiring 501*a* and the (2-1)-th wiring 502*a* may overlap each other in the first direction (e.g., z direction or −z direction) with the third insulating layer (see 114 of FIG. 16) and the fourth insulating layer (see 115 of FIG. 16) disposed therebetween. For example, the (1-2)-th wiring 501*b* and the (2-2)-th wiring 502*b* may overlap each other in the first direction (e.g., z direction or −z direction) with the third insulating layer (see 114 of FIG. 16) and the fourth insulating layer (see 115 of FIG. 16) disposed therebetween.

The first wiring 501 and the second wiring 502 may be electrically connected to each other through a first contact hole 21 formed in the third insulating layer (see 114 of FIG. 16) and the fourth insulating layer (see 115 of FIG. 16). Through the first contact hole 21, the first wiring 501 and the second wiring 502 may be electrically connected to each other. For example, through the first contact hole 21, the (1-1)-th wiring 501*a* and the (2-1)-th wiring 502*a* may be electrically connected to each other. In addition, through the first contact hole 21, the (1-2)-th wiring 501*b* and the (2-2)-th wiring 502*b* may be electrically connected to each other. The first contact hole 21 may be located at a boundary between the auxiliary display area ADA and the transmission area TA. In other words, the (1-1)-th wiring 501*a* and the (1-2)-th wiring 501*b* may be electrically connected to each other through the first contact hole 21 at a boundary between the auxiliary display area ADA and the transmission area TA. The (1-2)-th wiring 501*b* and the (2-2)-th wiring 502*b* may be electrically connected to each other through the first contact hole 21 at a boundary between the auxiliary display area ADA and the transmission area TA. The first contact hole 21 may be spaced apart from the third transistor T3 in the first direction (e.g., x direction or −x direction). In addition, the first contact hole 21 may be spaced apart from the fourth transistor T4 in the first direction (e.g., x direction or −x direction).

The (1-1)-th wiring 501*a*, which is integrally provided with the third lower gate electrode G3*a* of the third transistor T3, may be disposed under the third transistor T3 in the first direction (for example, z direction or −z direction), and the (1-1)-th wiring 501*a* may be electrically connected to the (2-1)-th wiring 502*a*, which is integrally provided with the third gate electrode G3*b* of the third transistor T3, so that a back bias voltage of the third transistor T3 as an oxide semiconductor may be held. In addition, the (1-2)-th wiring 501*b*, which is integrally provided with the fourth lower gate electrode G4*b* of the fourth transistor T4, may be disposed under the fourth transistor T4 in the first direction (for example, z direction or −z direction), and the (1-2)-th wiring 501*b* may be electrically connected to the (2-2)-th wiring 502*b*, which is integrally provided with the fourth gate electrode G4*b* of the fourth transistor T4, so that a back bias voltage of the fourth transistor T4 as an oxide semiconductor may be held.

In the related art, the first wiring disposed on the second insulating layer and the second wiring disposed on the fourth insulating layer may be disposed to extend in the first direction in the transmission area as well as the auxiliary display area. In other words, the first wiring and the second wiring could also be arranged in the transmission area. Since the first wiring and the second wiring are disposed in the transmission area, transmittance might not be secured in a component area of the display device.

In an embodiment of the present invention, the first wiring 501 may have an isolated shape in the component area CA, or the first wiring 501 and the second wiring 502 may extend in the first direction (e.g., x direction or −x direction) within the auxiliary display area ADA. The first wiring 501 and the second wiring 502 might not extend in the first direction (e.g., x direction or −x direction) in the transmission area TA. The first wiring 501 and the second wiring 502 might not be disposed in the transmission area TA. Since the first wiring 501 and the second wiring 502 are not disposed in the transmission area TA, transmittance in the transmission area TA may be increased.

Figure 14:
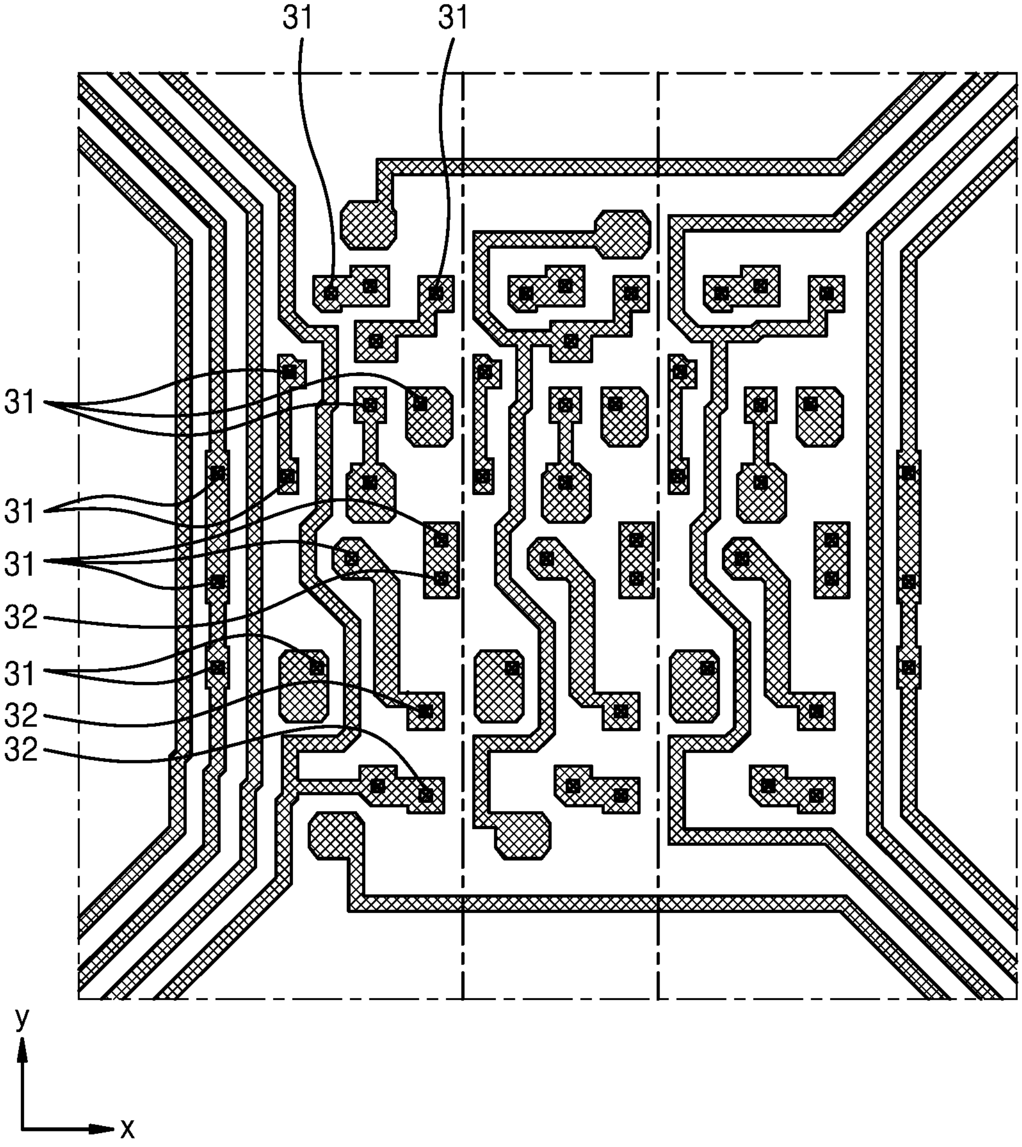

Referring to FIG. 14, a first connection electrode CM1 may be disposed on a fifth insulating layer (see 116 of FIG. 16). The first connection electrode CM1 may be integrally provided with first through eighth source electrodes of the first through eighth transistors (see T1, T2, T3, T4, T5, T6, T7, and T8 of FIG. 7A). A first source electrode, a second source electrode, a fifth source electrode, a sixth source electrode, a seventh source electrode, and an eighth source electrode may be electrically connected to a first source region S1 of a first semiconductor layer AS1, a second source region S2 of a second semiconductor layer AS2, a fifth source region S5 of a fifth semiconductor layer AS5, a sixth source region S6 of a sixth semiconductor layer AS6, a seventh source region S7 of a seventh semiconductor layer AS7, and an eighth source region S8 of an eighth semiconductor layer AS8, respectively, through the contact hole 31 formed in the first to fifth insulating layers (see 112, 113, 114, 115, and 116 of FIG. 16). The first connection electrode CM1 may be integrally provided with first through eighth source electrodes of the first through eighth transistors (see T1, T2, T3, T4, T5, T6, T7, and T8 of FIG. 7A). A first drain electrode, a second drain electrode, a fifth drain electrode, a sixth drain electrode, a seventh drain electrode, and an eighth drain electrode may be electrically connected to a first drain region D1 of the first semiconductor layer AS1, a second drain region D2 of the second semiconductor layer AS2, a fifth drain region D5 of the fifth semiconductor layer AS5, a sixth drain region D6 of the sixth semiconductor layer AS6, a seventh drain region D7 of the seventh semiconductor layer AS7, and an eighth drain region D8 of the eighth semiconductor layer AS8, respectively, through the contact hole 31 formed in the first to fifth insulating layers (see 112, 113, 114, 115, and 116 of FIG. 16).

In an embodiment of the present invention, the first connection electrode CM1 may be integrally provided with the third source electrode and the fourth source electrode of the third transistor T3 and the fourth transistor T4. The third source electrode and the fourth source electrode may be electrically connected to the third semiconductor layer AO3 and the fourth semiconductor layer AO4 through the contact hole 32 formed in the fourth insulating layer (see 115 of FIG. 16) and the fifth insulating layer (see 116 of FIG. 16). The first connection electrode CM1 may be integrally provided with the third drain electrode and the fourth drain electrode of the third transistor T3 and the fourth transistor T4. The third drain electrode and the fourth drain electrode may be electrically connected to the third semiconductor layer AO3 and the fourth semiconductor layer AO4 through the contact hole 32 formed in the fourth insulating layer 115 and the fifth insulating layer 116.

Figure 15:
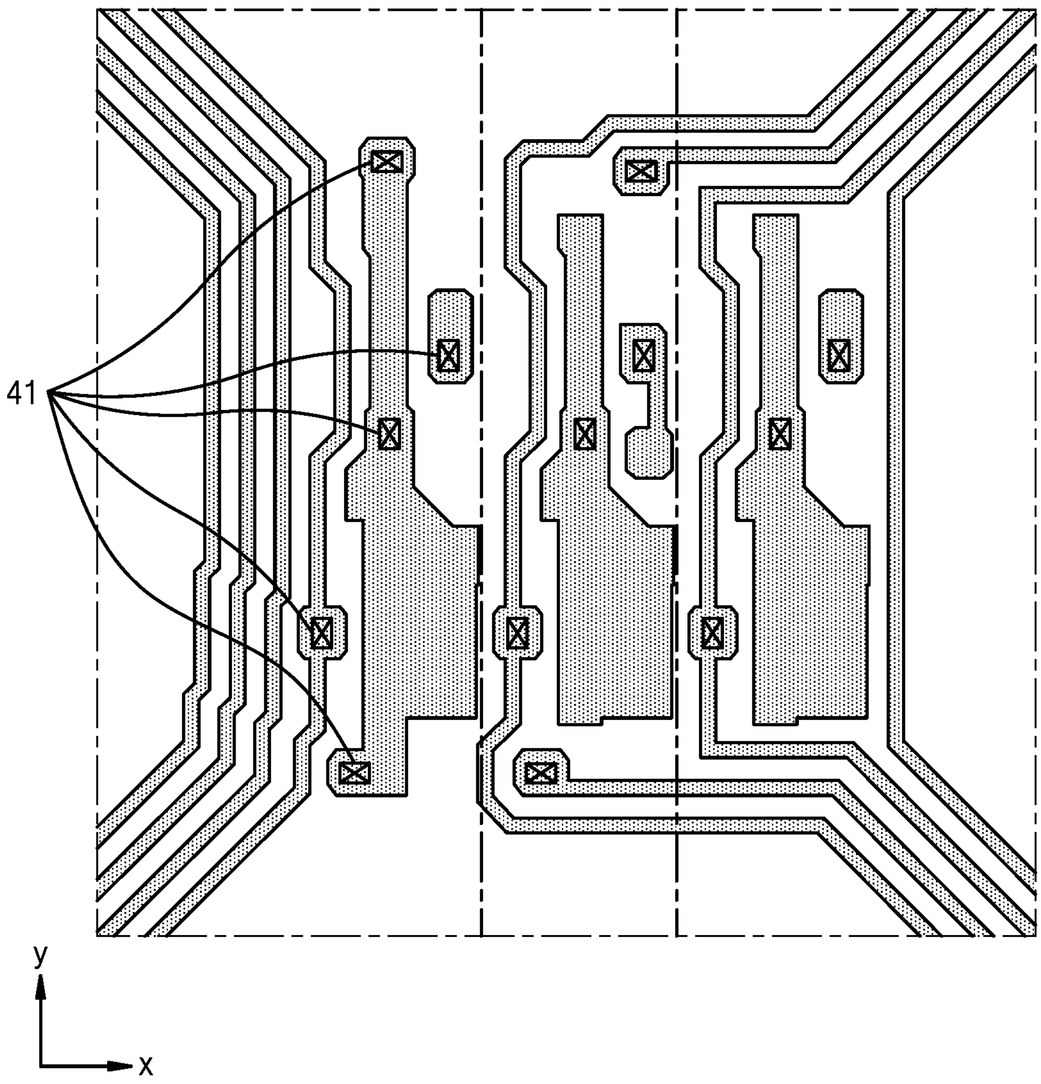

Referring to FIG. 15, a second connection electrode CM2 may be disposed on a first planarization layer (see 117 of FIG. 16). The second connection electrode CM2 may be electrically connected to the first connection electrode (see CM1 of FIG. 16) through a contact hole 41 formed in the first planarization layer (see 117 of FIG. 16). A second planarization layer (see 118 of FIG. 16) may be disposed on the second connection electrode CM2, and an auxiliary pixel electrode (see 210' of FIG. 4) may be disposed on the second planarization layer 118. The pixel electrode 210 may be electrically connected to the auxiliary sub-pixel circuit through the first connection electrode CM1 and the second connection electrode CM2.

Figure 18:
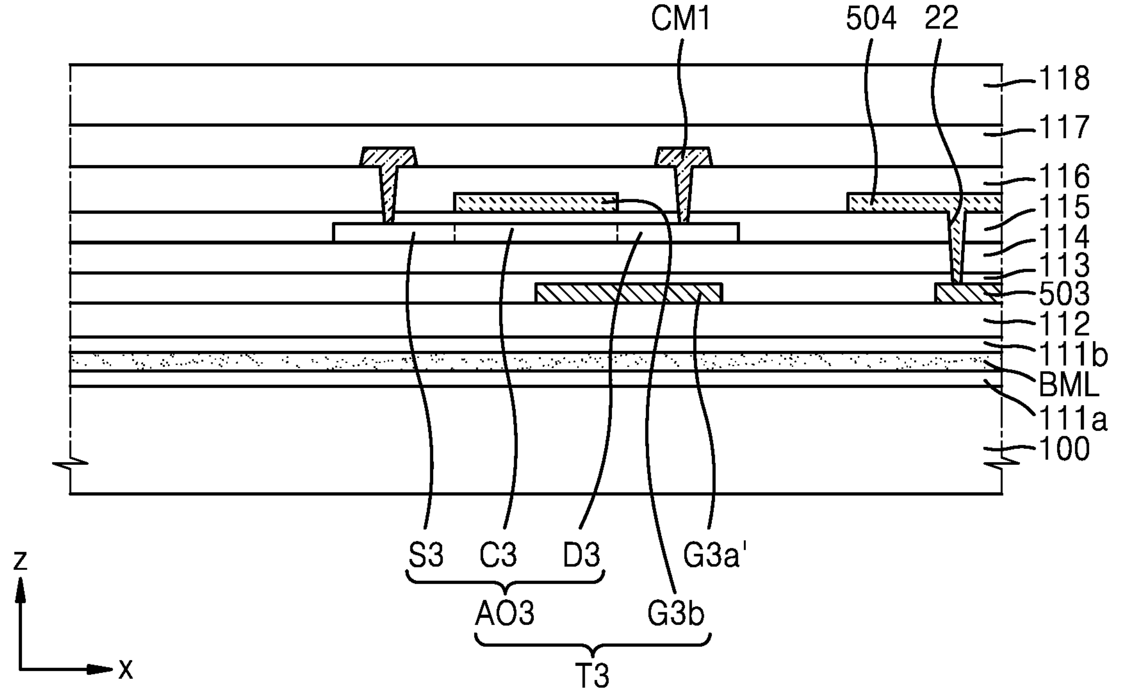
FIG. 18 is a cross-sectional view schematically illustrating a display device according to an embodiment of the present invention.

FIG. 16 is a schematic cross-sectional view of the display device taken along a line A-A' of FIGS. 7A and 7B, and FIG. 17 is a schematic cross-sectional view of the display device taken along a line B-B' of FIGS. 7A and 7B. FIG. 18 is a cross-sectional view schematically illustrating a display device according to an embodiment of the present invention.

Referring to FIG. 18, a first buffer layer 111*a* and a second buffer layer 111*b* may be arranged on the substrate 100. The first buffer layer 111*a* and the second buffer layer 111*b* may include at least one, for example, of silicon oxide ($SiO_2$), silicon nitride (SiNx), and silicon oxynitride (SiOXNY). A bottom metal layer BML may be disposed between the first buffer layer 111*a* and the second buffer layer 111*b*. The bottom metal layer BML may be disposed in the auxiliary display area ADA to prevent characteristics of a thin-film transistor may be prevented from being deteriorated by light emitted from a component.

A first insulating layer 112 and a second insulating layer 113 may be disposed on the second buffer layer 111*b*. The first insulating layer 112 and the second planarization layer 113 may include an inorganic insulating material such as silicon oxide ($SiO_2$), silicon nitride (SiNx), silicon oxynitride (SiOXNY), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 112 and the second semiconductor layer 113 may have a single layer or multi-layered structure including the above-described inorganic insulating materials.

The third lower gate electrode G3*a* and the (1-1)-th wiring 501*a* may be arranged on the second insulating layer 113. The (1-1)-th wiring 501*a* and the third lower gate electrode G3*a* may be independently illustrated on a cross section, but the (1-1)-th wiring 501*a* and the third lower gate electrode G3*a* may be integrally provided in a plan view. The third lower gate electrode G3*a* and the (1-1)-th wiring 501*a* may include the same material as each other. The third lower gate electrode G3*a* and the (1-1)-th wiring 501*a* may each include, for example, Mo, Al, Cu, Ti, etc., and may have a single layer or multi-layered structure.

A third insulating layer 114 may be arranged to cover the third lower gate electrode G3*a* and the (1-1)-th wiring 501*a*. The third insulating layer 114 may include an inorganic insulating material such as silicon oxide ($SiO_2$), silicon nitride (SiNx), silicon oxynitride (SiOXNY), aluminum oxide ($Al_2O_3$), titanium oxide ($TiO_2$), tantalum oxide ($Ta_2O_5$), hafnium oxide ($HfO_2$), or zinc oxide ($ZnO_2$). The third insulating layer 114 may have a single layer or multi-layered structure including the above-described inorganic insulating materials. The third insulating layer 114 may insulate the third lower gate electrode G3*a*, the (1-1)-th wiring 501*a*, and the third semiconductor layer AO3 from each other.

A third semiconductor layer AO3 may be arranged on the third insulating layer 114. The third semiconductor layer AO3 may include an oxide semiconductor. The third semiconductor layer AO3 may include a channel region C3, and a source region S3 and a drain region D3 at both sides of the channel region C3. A fourth insulating layer 115 may be disposed on the third semiconductor layer AO3 and may cover the third semiconductor layer AO3. The fourth insulating layer 115 may include an inorganic insulating material such as silicon oxide ($SiO_2$), silicon nitride (SiNx), silicon oxynitride (SIOXNY), aluminum oxide ($Al_2O_3$), titanium oxide ($TiO_2$), tantalum oxide ($Ta_2O_5$), hafnium oxide ($HfO_2$), or zinc oxide ($ZnO_2$). The fourth insulating layer 115 may have a single layer or multi-layered structure including the above-described inorganic insulating materials.

A third gate electrode G3*b* may be arranged on the fourth insulating layer 115. The third gate electrode G3*b* may be disposed to overlap the channel region C3 of the third semiconductor layer AO3. In addition, a (2-1)-th wiring 502*a* may be disposed on the fourth insulating layer 115. Although the (2-1)-th wiring 502*a* and the third gate electrode G3*b* are independently illustrated on a cross section, the (2-1)-th wiring 502*a* and the third gate electrode G3*b* may be integrally provided in a plane view. The (2-1)-th wiring 502*a* and the third gate electrode G3*b* may include the same material as each other. The (2-1)-th wiring 502*a* and the third gate electrode G3*b* may each include, for example, Mo, Al, Cu, Ti, etc., and may have a single layer or multi-layered structure.

The (1-1)-th wiring 501*a* and the (2-1)-th wiring 502*a* may be electrically connected to each other through the first contact hole 21 formed in the third insulating layer 114 and the fourth insulating layer 115. Since the (1-1)-th wiring 501*a* and the (2-1)-th wiring 502*a* may be electrically connected to each other through the first contact hole 21, the (1-1)-th wiring 501*a* and the (2-1)-th wiring 502*a* might not need to extend to edges of the display device 1 after passing the transmission area TA to be electrically connected to each other. Since the (1-1)-th wiring 501*a* and the (2-1)-th wiring 502*a* may be electrically connected to each other through the first contact hole 21, the (1-1)-th wiring 501*a* and the (2-1)-th wiring 502*a* might not pass through the transmission area TA, and transmittance of the transmission area TA of the component area CA may be increased.

A fifth insulating layer 116 may be disposed on the third gate electrode G3*b*. The fifth insulating layer 116 may include an inorganic insulating material such as silicon oxide ($SiO_2$), silicon nitride (SiNx), silicon oxynitride (SIOXNY), aluminum oxide ($Al_2O_3$), titanium oxide ($TiO_2$), tantalum oxide ($Ta_2O_5$), hafnium oxide ($HfO_2$), or zinc oxide ($ZnO_2$). The fifth insulating layer 116 may have a single layer or multi-layered structure including the above-described inorganic insulating materials.

A first connection electrode CM1 may be arranged on the fifth insulating layer 116. The first connection electrode CM1 may be integrally provided with the third source electrode and the third drain electrode. The third source electrode disposed on the fifth insulating layer 116 may be electrically connected to the source region S3 of the third semiconductor layer AO3, and the third drain electrode disposed on the fifth insulating layer 116 may be electrically connected to the drain region D3 of the third semiconductor layer AO3.

A first planarization layer 117 and a second planarization layer 118 may be disposed on the first connection electrode CM1. The first planarization layer 117 and the second planarization layer 118 may each include a general common use polymer such as Benzocyclobutene (BCB), polyimide, hexamethyldisiloxane (HMDSO), polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, or a vinyl alchohol-based polymer, or the like. However, the present invention is not limited thereto.

A second connection electrode CM2 may be disposed between the first planarization layer 117 and the second planarization layer 118. The second connection electrode CM2 may be electrically connected to the first connection electrode CM1 through a contact hole formed in the first planarization layer 117. In addition, the second connection electrode CM2 may be electrically connected to the auxiliary pixel electrode 210' through a contact hole formed in the second planarization layer 118.

Referring to FIG. 17, a first transistor T1 may be disposed on the substrate 100. A first semiconductor layer AS1 including a channel region C1 and a source region S1 and a drain region D1 disposed on both sides of the channel region C1 may be disposed on the substrate 100. A first gate electrode G1 may be disposed on the first semiconductor layer AS1 with the first insulating layer 112 disposed therebetween. The first gate electrode G1 may be disposed to overlap the channel region C1 of the first semiconductor layer AS1. The source region S1 of the first semiconductor layer AS1 may be electrically connected to a first source electrode disposed on the fifth insulating layer 116. The drain region D1 of the first semiconductor layer AS1 may be electrically connected to a first drain electrode disposed on the fifth insulating layer 116. The first source electrode and the first drain electrode may be provided integrally with the first connection electrode CM1.

A second electrode CE2 of the storage capacitor Cst may be disposed on the first gate electrode G1 with the second insulating layer 113 disposed therebetween. The second electrode CE2 of the storage capacitor Cst may include an opening SOP. The opening SOP may be formed by removing a portion of the second electrode CE2 and may have a closed shape. The first electrode CE1 of the storage capacitor Cst may be provided integrally with the first gate electrode G1.

In an embodiment of the present invention, third through fifth insulating layers 114, 115, and 116 may be arranged on the second electrode CE2 of the storage capacitor Cst. The first connection electrode CM1 may be disposed on the fifth insulating layer 116 and may penetrate the third through fifth insulating layers 114, 115, and 116. The first planarization layer 117 may be disposed on the first connection electrode CM1, and the second planarization layer 118 may be disposed on the first planarization layer 117.

Referring to FIG. 18, a third lower gate electrode G3*a*' and a third wiring 503 may be arranged on the first insulating layer 112. In addition, the third lower gate electrode G3*a*' and the third wiring 503 may include the same material as a material for the first gate electrode G1 that is disposed on the first insulating layer 112. On the cross section, the third lower gate electrode G3*a*' and the third wiring 503 are independently illustrated, but the third lower gate electrode G3*a*' and the third wiring 503 may be integrally provided in a plan view. The third lower gate electrode G3*a*' and the third wiring 503 may include the same material as each other. The third lower gate electrode G3*a*' and the third wiring 503 may each include, for example, Mo, Al, Cu, Ti, etc., and may have a single layer or multi-layered structure.

The third wiring 503 may extend in the first direction (e.g., x direction or −x direction) in the auxiliary display area ADA in a plan view. The third wiring 503 may extend in the first direction (e.g., x direction or −x direction) in the auxiliary display area ADA and may have an isolated shape. The third wiring 503 might not pass through the transmission area TA. The third wiring 503 may be provided integrally with the third lower gate electrode G3*a*'.

A third transistor T3 may be arranged on the third insulating layer 114. A third semiconductor layer AO3, which includes a channel region C3 and a source region S3 and a drain region D3 disposed on both sides of the channel region C3, may be disposed on the third insulating layer 114, and a third gate electrode G3*b* may be disposed on the third semiconductor layer AO3.

The third lower gate electrode G3*b* and a fourth wiring 504 may be arranged on the fourth insulating layer 115. On the cross section, the third gate electrode G3*b* and the fourth wiring 504 are independently illustrated, but the third gate electrode G3*b* and the fourth wiring 504 may be integrally provided in a plan view. The third gate electrode G3*b* and the fourth wiring 504 may include the same material as each other. The third gate electrode G3*b* and the fourth wiring 504 may each include, for example, Mo, Al, Cu, Ti, etc., and may have a single layer or multi-layered structure.

The fourth wiring 504 may extend in the first direction (e.g., x direction or −x direction) in the auxiliary display area ADA in a plan view. The fourth wiring 504 might not pass through the transmission area TA. The fourth wiring 504 may be provided integrally with the third gate electrode G3*b*.

The third wiring 503 and the fourth wiring 504 may be electrically connected to each other through a contact hole 22 formed in the second through fourth insulating layers 113, 114, and 115. The third wiring 503 and the fourth wiring 503 are electrically connected to each other through the contact hole 22 formed in the second through fourth insulating layers 113, 114 and 115, so that the third wiring 503 and the fourth wiring 504 may pass through the transmission area TA and might not extend to an outside of the display device, and transmittance of the component area CA may be increased.

In the related art, the first wiring disposed on the second insulating layer and the second wiring disposed on the fourth insulating layer may be disposed to extend in the first direction in the transmission area as well as the auxiliary display area. In other words, the first wiring and the second wiring could also be arranged in the transmission area. Since the first wiring and the second wiring are disposed in the transmission area, transmittance might not be secured in a component area of the display device.

In an embodiment of the present invention, the first wiring 501 may have an isolated shape in the component area CA, or the first wiring 501 and the second wiring 502 may extend in the first direction (e.g., x direction or −x direction) only within the auxiliary display area ADA. The first wiring 501 and the second wiring 502 might not extend in the first direction (e.g., x direction or −x direction) in the transmission area TA. Since the first wiring 501 and the second wiring 502 are not disposed in the transmission area TA, transmittance in the transmission area TA may be increased.

The first wiring 501 may be provided at a lower portion of the third transistor T3 or the fourth transistor T4 and may extend in the first direction (e.g., x direction or −x direction), and the first wiring 501 and the second wiring 502 may be electrically connected to each other through the first contact hole 21 so that a back bias voltage of the third transistor T3 as an oxide semiconductor may be held.

According to an embodiment of the present invention described above, a display device with increased transmittance of a component area of the display device can be implemented. Of course, the scope of the present invention is not limited thereby.

While the present invention has been described with reference to exemplary embodiments thereof, it will be understood by those of ordinary skill in the art that various changes in form and details may be made thereto without departing from the spirit and scope of the present invention.

What is claimed is:

1. A display device comprising:

a substrate comprising a main display area, a component area, and a peripheral area, wherein the component area includes a transmission area and an auxiliary display area that is spaced apart from the main display area with the transmission area disposed therebetween;

a first thin-film transistor disposed in the component area and comprising a first semiconductor layer and a first gate electrode insulated from the first semiconductor layer;

a second thin-film transistor disposed in the component area and comprising a second semiconductor layer and a second gate electrode insulated from the second semiconductor layer;

a third gate electrode interposed between the first semiconductor layer and the second gate electrode and insulated from the first semiconductor layer and the second gate electrode;

a first wiring disposed to extend in a first direction within the auxiliary display area of the component area, and provided on a same layer and with a same material as the third gate electrode; and a second wiring disposed to extend in the first direction within the auxiliary display area of the component area, and provided on a same layer and with a same material as the second gate electrode, wherein the first wiring and the second wiring are electrically connected to each other through a first contact hole penetrating insulating layers disposed between the first wiring and the second wiring.

2. The display device of claim 1, wherein the first wiring and the second wiring overlap at least a portion of the second semiconductor layer.

3. The display device of claim 1, wherein the first wiring is disposed only in the auxiliary display area of the component area.

4. The display device of claim 1, wherein the first wiring and the second wiring are disposed to overlap each other in the auxiliary display area of the component area.

5. The display device of claim 1, wherein the first contact hole is located at a boundary between the auxiliary display area and the transmission area.

6. The display device of claim 1, wherein the first contact hole is spaced apart from the second thin-film transistor in the first direction.

7. The display device of claim 1, wherein the second wiring is disposed in the component area and comprises a bypass line bypassing the transmission area.

8. The display device of claim 7, further comprising a bottom metal layer disposed in the component area and comprising a first hole corresponding to the transmission area.

9. The display device of claim 8, wherein the bypass line overlaps the bottom metal layer.

10. The display device of claim 1, further comprising main sub-pixels arranged in the main display area.

11. The display device of claim 1, further comprising a plurality of auxiliary sub-pixels arranged in the auxiliary display area.

12. The display device of claim 10, wherein the main sub-pixels comprise a main display element and a main pixel circuit electrically connected to the main display element.

13. The display device of claim 11, wherein the auxiliary sub-pixels comprise an auxiliary display element and an auxiliary sub-pixel circuit electrically connected to the auxiliary display element, and the auxiliary sub-pixel circuit comprises the first thin-film transistor and the second thin-film transistor.

14. The display device of claim 1, further comprising a component disposed below the substrate to correspond to the component area, wherein the component comprises an image capturing device or a sensor.

15. A display device comprising:

a substrate comprising a main display area, a component area, and a peripheral area, wherein the component area comprises a transmission area and auxiliary display areas that are spaced apart from each other with the transmission area therebetween;

a first thin-film transistor disposed in the component area and comprising a first semiconductor layer and a first gate electrode insulated from the first semiconductor layer;

a second thin-film transistor disposed in the component area and comprising a second semiconductor layer and a second gate electrode insulated from the second semiconductor layer;

a first wiring disposed to extend in a first direction within an auxiliary display area of the component area, and provided on a same layer and with a same material as the first gate electrode; and a second wiring disposed to extend in the first direction within an auxiliary display area of the component area, and provided on a same layer and with a same material as the second gate electrode, wherein the first wiring and the second wiring are electrically connected to each other through a first contact hole formed in an insulating layer that is between the first wiring and the second wiring.

16. The display device of claim 15, wherein the first wiring and the second wiring overlap at least a portion of the second semiconductor layer.

17. The display device of claim 15, wherein the first wiring has an isolated shape only in the auxiliary display area of the component area.

18. The display device of claim 15, wherein the first wiring and the second wiring are disposed to overlap each other in the auxiliary display area of the component area.

19. The display device of claim 15, wherein the first contact hole is located at a boundary that is between the auxiliary display area and the transmission area.

20. The display device of claim 15, wherein the first contact hole is spaced apart from the second thin-film transistor in the first direction.

* * * * *